US012660625B2

(12) United States Patent
Yen et al.

(10) Patent No.: US 12,660,625 B2
(45) Date of Patent: Jun. 16, 2026

(54) SEMICONDUCTOR DEVICE AND METHOD OF MAKING

(71) Applicant: Taiwan Semiconductor Manufacturing Company Limited, Hsin-Chu (TW)

(72) Inventors: Chen-Hsuan Yen, Taichung City (TW); Jen-Yuan Chang, Hsinchu City (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 383 days.

(21) Appl. No.: 18/205,030

(22) Filed: Jun. 2, 2023

(65) Prior Publication Data

US 2024/0404965 A1     Dec. 5, 2024

(51) Int. Cl.
| | |
|---|---|
| *H10W 42/00* | (2026.01) |
| *H10P 72/70* | (2026.01) |
| *H10W 20/00* | (2026.01) |
| *H10W 20/42* | (2026.01) |

(52) U.S. Cl.
CPC ............. *H10W 42/00* (2026.01); *H10P 72/74* (2026.01); *H10W 20/084* (2026.01); *H10W 20/42* (2026.01); *H10W 42/121* (2026.01)

(58) Field of Classification Search
CPC . H01L 23/585; H01L 23/5226; H01L 23/562; H01L 21/6835; H01L 21/76807; H10W 42/00; H10W 42/121; H10W 20/084; H10W 20/42; H10P 72/74

USPC .......................................................... 257/620
See application file for complete search history.

(56) References Cited

U.S. PATENT DOCUMENTS

| | | | |
|---|---|---|---|
| 2019/0385951 A1* | 12/2019 | Chu .................... | H01L 23/5383 |
| 2022/0375878 A1 | 11/2022 | Hu et al. | |
| 2023/0106039 A1 | 4/2023 | Ho et al. | |

FOREIGN PATENT DOCUMENTS

| | | |
|---|---|---|
| TW | 202221885 A | 6/2022 |
| TW | 202310266 A | 3/2023 |

OTHER PUBLICATIONS

Office Action received in corresponding Taiwanese patent application No. 112143527, dated Oct. 4, 2024, 20 pages.

* cited by examiner

*Primary Examiner* — Tu-Tu V Ho
(74) *Attorney, Agent, or Firm* — Cooper Legal Group, LLC

(57)     ABSTRACT

A semiconductor device is provided. The semiconductor device includes one or more conductive structures and a protective ring. The protective ring includes a first portion and a second portion at a higher elevation than the first portion. The one or more conductive structures are laterally surrounded by the first portion of the protective ring. The one or more conductive structures are laterally surrounded by the second portion of the protective ring. In one or more first regions of the protective ring, the first portion of the protective ring is not vertically coincident with the second portion of the protective ring.

20 Claims, 14 Drawing Sheets

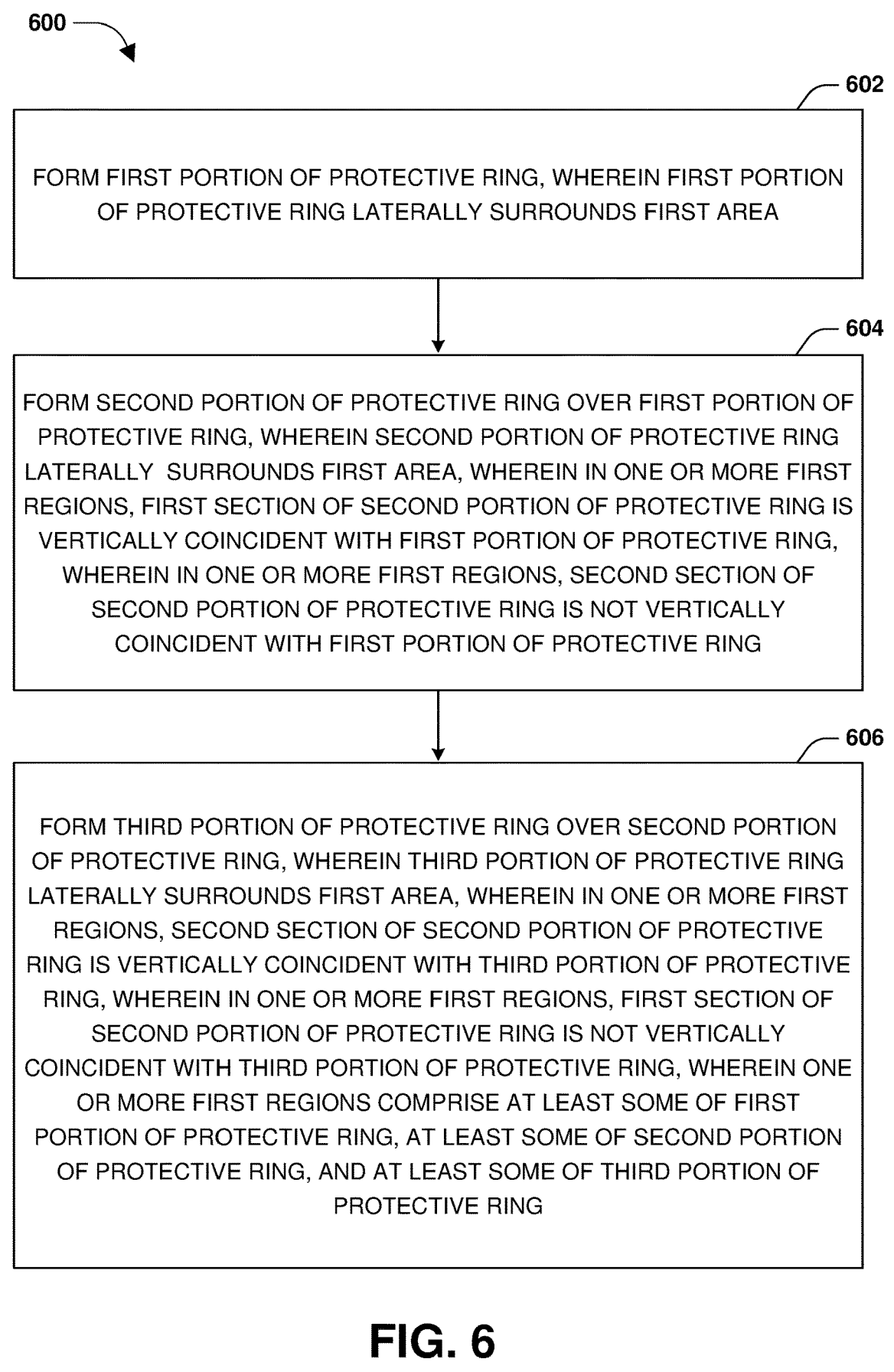

600

602

FORM FIRST PORTION OF PROTECTIVE RING, WHEREIN FIRST PORTION OF PROTECTIVE RING LATERALLY SURROUNDS FIRST AREA

604

FORM SECOND PORTION OF PROTECTIVE RING OVER FIRST PORTION OF PROTECTIVE RING, WHEREIN SECOND PORTION OF PROTECTIVE RING LATERALLY SURROUNDS FIRST AREA, WHEREIN IN ONE OR MORE FIRST REGIONS, FIRST SECTION OF SECOND PORTION OF PROTECTIVE RING IS VERTICALLY COINCIDENT WITH FIRST PORTION OF PROTECTIVE RING, WHEREIN IN ONE OR MORE FIRST REGIONS, SECOND SECTION OF SECOND PORTION OF PROTECTIVE RING IS NOT VERTICALLY COINCIDENT WITH FIRST PORTION OF PROTECTIVE RING

606

FORM THIRD PORTION OF PROTECTIVE RING OVER SECOND PORTION OF PROTECTIVE RING, WHEREIN THIRD PORTION OF PROTECTIVE RING LATERALLY SURROUNDS FIRST AREA, WHEREIN IN ONE OR MORE FIRST REGIONS, SECOND SECTION OF SECOND PORTION OF PROTECTIVE RING IS VERTICALLY COINCIDENT WITH THIRD PORTION OF PROTECTIVE RING, WHEREIN IN ONE OR MORE FIRST REGIONS, FIRST SECTION OF SECOND PORTION OF PROTECTIVE RING IS NOT VERTICALLY COINCIDENT WITH THIRD PORTION OF PROTECTIVE RING, WHEREIN ONE OR MORE FIRST REGIONS COMPRISE AT LEAST SOME OF FIRST PORTION OF PROTECTIVE RING, AT LEAST SOME OF SECOND PORTION OF PROTECTIVE RING, AND AT LEAST SOME OF THIRD PORTION OF PROTECTIVE RING

FIG. 6

SEMICONDUCTOR DEVICE AND METHOD OF MAKING

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow diagram illustrating a method in accordance with some embodiments.

DETAILED DESCRIPTION

Figure 1A:
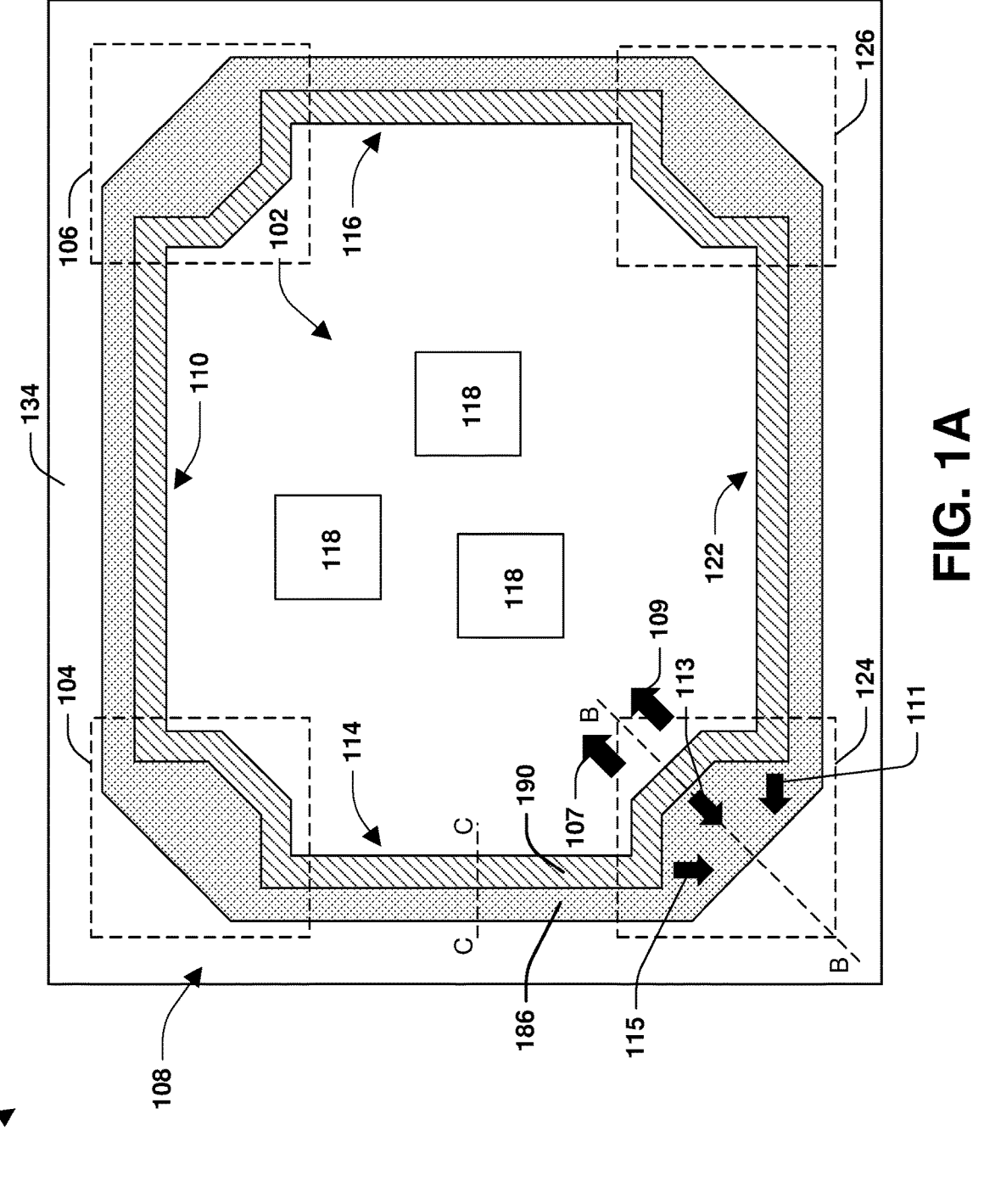
FIG. 1A illustrates a top view of a semiconductor device in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

The term "overlying" and/or the like may be used to describe one element or feature being vertically coincident with and at a higher elevation than another element or feature. For example, a first element overlies a second element if the first element is at a higher elevation than the second element and at least a portion of the first element is vertically coincident with at least a portion of the second element.

The term "underlying" and/or the like may be used to describe one element or feature being vertically coincident with and at a lower elevation than another element or feature. For example, a first element underlies a second element if the first element is at a lower elevation than the second element and at least a portion of the first element is vertically coincident with at least a portion of the second element.

The term "over" may be used to describe one element or feature being at a higher elevation than another element or feature. For example, a first element is over a second element if the first element is at a higher elevation than the second element.

The term "under" may be used to describe one element or feature being at a lower elevation than another element or feature. For example, a first element is under a second element if the first element is at a lower elevation than the second element.

A semiconductor device has a protective ring laterally surrounding an area. The protective ring at least one of protects, shields, electrically isolates, etc. the area. In some embodiments, the protective ring protects the area from at least one of moisture, contaminants, etc. introduced in one or more fabrication processes performed in one or more stages of fabrication of the semiconductor device, such as at least one of dicing, sawing, etc. In some embodiments, the protective ring includes a first portion and a second portion at a higher elevation than the first portion. In one or more first regions of the protective ring, such as corner regions of the protective region, the first portion of the protective ring is laterally offset from the second portion of the protective ring such that the first portion is not vertically coincident with the second portion. In some embodiments, implementing the offset between the first portion and the second portion reduces an amount of stress on one or more portions of the semiconductor device, as compared to implementations in which a protective ring extends vertically in a single vertical axis. In some embodiments, in chips comprising protective rings that extend vertically in a single vertical axis, an amount of stress induced by the protective rings can damage the chips via at least one of corner film delamination, peeling, etc. Thus, in accordance with some embodiments, the reduction to the amount of stress on the one or more portions of the semiconductor device provides for a decrease in at least one of damage, wafer defects, etc. to the semiconductor device and provides for improved performance, stability, quality, etc. of the semiconductor device.

Figure 1B:
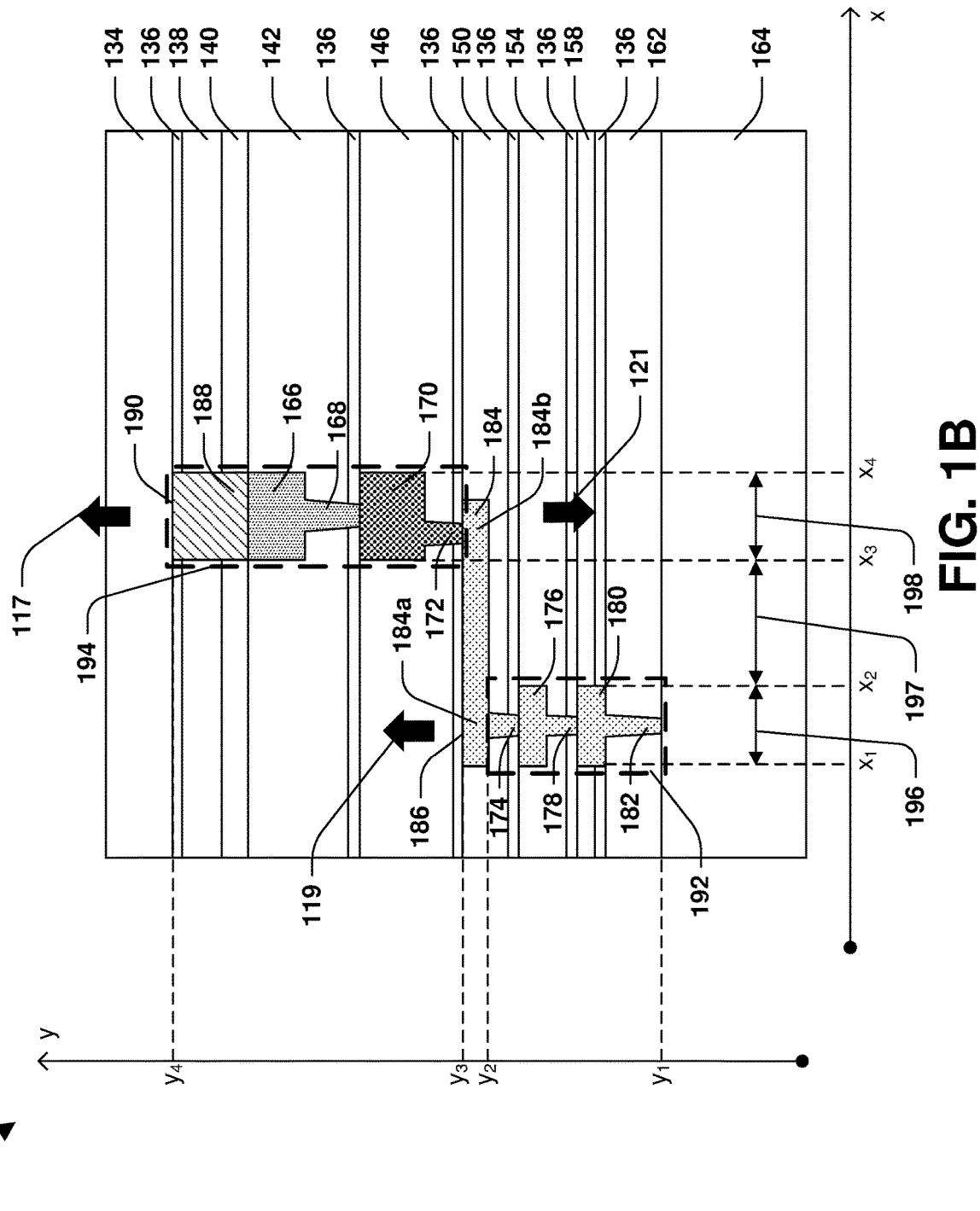
FIG. 1B illustrates a cross-sectional view of a semiconductor device in accordance with some embodiments.
Figure 1C:
FIG. 1C illustrates a cross-sectional view of a semiconductor device in accordance with some embodiments.

FIGS. 1A-1C illustrate a semiconductor device 100 according to some embodiments. FIG. 1A illustrates a top view of the semiconductor device 100. FIG. 1B illustrates a cross-sectional view of the semiconductor device 100 taken along lines B-B of FIG. 1A. FIG. 1C illustrates a cross-sectional view of the semiconductor device 100 taken along lines C-C of FIG. 1A. In some embodiments, the semiconductor device 100 comprises a System on Integrated Chips (SoIC) die.

The semiconductor device 100 comprises a protective ring 108, such as at least one of a seal ring, a guard ring, etc. In some embodiments, the protective ring 108 laterally surrounds at least one of a first area 102 or one or more conductive structures 118 in the first area 102. In some embodiments, the protective ring 108 is continuous so as to laterally surround, encircle, etc. all of the first area 102 and/or the one or more conductive structures 118. In some embodiments, the protective ring 108 is discontinuous or has a break so as to laterally surround, encircle, etc. some but not all of the first area 102 and/or the one or more conductive structures 118.

In some embodiments, the semiconductor device 100 comprises a first semiconductor layer 134 overlying the protective ring 108. For ease of illustration, layers, features, elements, etc. overlying the protective ring 108 and/or the one or more conductive structures 118 are removed in FIG. 1A to show a top view of the protective ring 108 and/or the one or more conductive structures 118. In accordance with some embodiments, a top surface 186 of a metal layer 184 (shown in FIGS. 1B and 1C) of the protective ring 108 and a top surface 190 of a metal layer 188 (shown in FIGS. 1B and 1C) of the protective ring 108 are depicted in FIG. 1A. In some embodiments, the top surface 186 and the top surface 190 are at different elevations. To distinguish the top surface 186 and the top surface 190 from each other, FIG. 1A depicts a dot pattern for the top surface 186 and a diagonal-line pattern for the top surface 190.

In some embodiments, the one or more conductive structures 118 comprise at least one of one or more contacts, one or more routing components, one or more interconnect structures, one or more vias, one or more metal layers, one or more metal lines, etc. In some embodiments, at least some of the one or more conductive structures 118 comprise at least one of aluminum, copper, tin, nickel, gold, silver, tungsten, TaN, $Al_2O_3$, $ZrO_2$, or other suitable material. In some embodiments, at least some of the one or more conductive structures 118 have a same composition as at least some of the protective ring 108. In some embodiments, at least some of the one or more conductive structures 118 have a different composition than at least some of the protective ring 108. In some embodiments, at least some of the one or more conductive structures 118 have different compositions as compared to other conductive structures 118.

In some embodiments, the protective ring 108 comprises a first wall 110, a second wall 122 opposing the first wall 110, a third wall 114, and a fourth wall 116 opposing the third wall 114. At least some of the one or more conductive structures 118 are between the first wall 110 and the second wall 122, and at least some of the one or more conductive structures 118 are between the third wall 114 and the fourth wall 116. In some embodiments, the protective ring 108 comprises at least one of a first corner region 104 separating the first wall 110 from the third wall 114, a second corner region 106 separating the fourth wall 116 from the first wall

110, a third corner region 126 separating the second wall 122 from the fourth wall 116, or a fourth corner region 124 separating the third wall 114 from the second wall 122. Other structures and/or configurations of walls and/or corner regions of the protective ring 108 relative to other elements, features, etc. are within the scope of the present disclosure.

According to some embodiments, the protective ring 108 at least one of protects, shields, electrically isolates, etc. at least one of the semiconductor device 100, the one or more conductive structures 118, or one or more other layers, features, etc. of the semiconductor device 100. In some embodiments, the protective ring 108 provides support, reinforcement, structural integrity, etc. for at least one of the semiconductor device 100, the one or more conductive structures 118, or one or more other layers, features, etc. of the semiconductor device 100.

The view depicted in FIG. 1B includes a cross-section of the fourth corner region 124 of the protective ring 108, in accordance with some embodiments. In some embodiments, the semiconductor device 100 comprises at least one of a substrate 164, a second semiconductor layer 162 over the substrate 164, a first dielectric layer 158 over the second semiconductor layer 162, a second dielectric layer 154 over the first dielectric layer 158, a third dielectric layer 150 over the second dielectric layer 154, a fourth dielectric layer 146 over the third dielectric layer 150, a fifth dielectric layer 142 over the fourth dielectric layer 146, a first passivation layer 140 over the fifth dielectric layer 142, a third semiconductor layer 138 over the first passivation layer 140, or the first semiconductor layer 134 over the third semiconductor layer 138.

In some embodiments, the substrate 164 comprises at least one of an epitaxial layer, a silicon-on-insulator (SOI) structure, a wafer, or a die formed from a wafer. The substrate 164 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. According to some embodiments, the substrate 164 comprises monocrystalline silicon, crystalline silicon with a <100> crystallographic orientation, crystalline silicon with a <110> crystallographic orientation or other suitable material. In some embodiments, the substrate 164 comprises at least one doped region. Other structures and/or configurations of the substrate 164 are within the scope of the present disclosure.

The second semiconductor layer 162 comprises at least one of silicon, an oxide semiconductor material such as silicon oxide, a nitride semiconductor material such as silicon nitride, an oxide nitride material, or other suitable material. In some embodiments, the second semiconductor layer 162 is an interlayer dielectric (ILD) layer. In some embodiments, the second semiconductor layer 162 comprises at least one of tetraethylorthosilicate (TEOS), borophosphosilicate glass (BPSG), fused silica glass (FSG), phosphosilicate glass (PSG), boron doped silicon glass (BSG), polymeric thermoset material, or other suitable material. Other structures and/or configurations of the second semiconductor layer 162 are within the scope of the present disclosure. The second semiconductor layer 162 is formed by at least one of physical vapor deposition (PVD), sputtering, chemical vapor deposition (CVD), plasma enhanced CVD (PECVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques.

In some embodiments, at least one of the dielectric layers 158, 154, 150, 146, or 142 comprises at least one of an oxide semiconductor material such as silicon oxide, a nitride semiconductor material such as silicon nitride, an oxide nitride material, a polymer, polybenzobisoxazole (PBO), a polyimide (PI), a metal nitride, silicon, germanium, carbide, gallium, arsenide, arsenic, indium, sapphire, or other suitable materials. In some embodiments, at least one of the dielectric layers 158, 154, 150, 146, or 142 electrically insulates at least one of the protective ring 108 or other layers, features, etc. of the semiconductor device 100. In some embodiments, at least one of the dielectric layers 158, 154, 150, 146, or 142 is formed by at least one of PVD, sputtering, CVD, PECVD, LPCVD, ALCVD, UHVCVD, RPCVD, ALD, MBE, LPE, spin on, growth, or other suitable techniques. In some embodiments, at least some of the dielectric layers 158, 154, 150, 146, or 142 are formed in a same manner. In some embodiments, at least some of the dielectric layers 158, 154, 150, 146, or 142 are formed in different manners.

In some embodiments, the first passivation layer 140 comprises at least one of silicon, an oxide semiconductor material, a nitride semiconductor material, an oxide nitride material, AlN, $Al_2O_3$, $SiO_2$, $Si_3N_4$, or other suitable material. In some embodiments, the first passivation layer 140 comprises a chemically inert, corrosion-resistant dielectric material. In some embodiments, the first passivation layer 140 comprises an organic compound having at least one of an N-, P- or S-group molecular structure. In some embodiments, the first passivation layer 140 is formed by at least one of PVD, sputtering, CVD, PECVD, LPCVD, ALCVD, UHVCVD, RPCVD, ALD, MBE, LPE, spin on, growth, a passivation process, or other suitable techniques. In some embodiments, a chemically-stable material is used to produce the first passivation layer 140. In some embodiments, the passivation process is a process in which a film covers an underlying material. In some embodiments, the underlying material comprises at least some of the fifth dielectric layer 142. In some embodiments, the film inhibits dissolution of the underlying material. In some embodiments, the film reduces chemical reactivity with regard to the underlying material. In some embodiments, the film reduces electrical reactivity with regard to the underlying material. In some embodiments, the passivation process includes at least one of oxidation of a surface of the underlying material or complexing of the surface with an organic compound. In some embodiments, the first passivation layer 140 inhibits diffusion of at least one of charges, atoms, or ions into the underlying material. In some embodiments, the first passivation layer 140 mitigates oxidation of the underlying material. In some embodiments, the first passivation layer 140 protects the underlying material from environmental conditions. In some embodiments, the first passivation layer 140 acts as a diffusion barrier with regard to the underlying material.

In some embodiments, the third semiconductor layer 138 comprises at least one of silicon, an oxide semiconductor material such as silicon oxide, a nitride semiconductor material such as silicon nitride, an oxide nitride material, or other suitable material. In some embodiments, the third semiconductor layer 138 is formed by at least one of PVD, sputtering, CVD, PECVD, LPCVD, ALCVD, UHVCVD, RPCVD, ALD, MBE, LPE, spin on, growth, or other suitable techniques.

In some embodiments, the first semiconductor layer 134 comprises at least one of silicon, an oxide semiconductor material such as silicon oxide, a nitride semiconductor material such as silicon nitride, an oxide nitride material, or other suitable material. In some embodiments, the first semiconductor layer 134 is formed by at least one of PVD, sputtering, CVD, PECVD, LPCVD, ALCVD, UHVCVD, RPCVD, ALD, MBE, LPE, spin on, growth, or other suitable techniques.

In some embodiments, the semiconductor device 100 comprises one or more etch stop layers 136, such as between adjacent layers of the semiconductor device 100. In some embodiments, an etch stop layer has a different etch selectively relative to an overlying or adjacent layer such that when an etchant etches through the overlying layer the etching process slows or stops upon the etchant encountering the underlying etch stop layer. According to some embodiments, an etch stop layer comprises silicon, carbon, or other suitable material. In some embodiments, at least some different etch stop layers have different compositions, such as due to the use of different etchants to etch different materials. In some embodiments, the etch stop layer 136 between the third semiconductor layer 138 and the first semiconductor layer 134 has a different composition than at least one other etch stop layer 136, such as due to a different etchant used to etch the first semiconductor layer 134 as compared an etchant used to etch at least one of the dielectric layers 158, 154, 150, 146, or 142. In some embodiments, an etch stop layer 136 is formed by at least one of PVD, sputtering, CVD, PECVD, LPCVD, ALCVD, UHVCVD, RPCVD, ALD, MBE, LPE, spin on, growth, or other suitable techniques.

In some embodiments, the protective ring 108 is provided within one or more first dielectric layers of the semiconductor device 100. For example, according to some embodiments, the protective ring 108 extends through at least some of the one or more first dielectric layers and/or through at least some of one or more other layers of the semiconductor device 100. In some embodiments, the protective ring 108 is provided within the first passivation layer 140. For example, according to some embodiments, the protective ring 108 extends through at least some of the first passivation layer 140 and/or through at least some of one or more other layers of the semiconductor device 100. In some embodiments, the one or more first dielectric layers comprise at least one of the dielectric layers 158, 154, 150, 146, or 142. According to some embodiments, the protective ring 108 includes alternating layers of a metal layer and a via (which may also be referred to as a vertical interconnect access (VIA)). In some embodiments, the protective ring 108 comprises at least one of a via 182, a metal layer 180 overlying the via 182, a via 178 overlying the metal layer 180, a metal layer 176 overlying the via 178, a via 174 overlying the metal layer 176, a metal layer 184 overlying the via 174, a via 172 overlying the metal layer 184, a metal layer 170 overlying the via 172, a via 168 overlying the metal layer 170, a metal layer 166 overlying the via 168, or the metal layer 188 overlying the metal layer 166. In some embodiments, a metal layer or via of the protective ring 108 is in contact with, such as in direct contact with, an adjacent via or metal layer. In some embodiments, at least one of the metal layer 180 is in contact with the via 182, the via 178 is in contact with the metal layer 180, the metal layer 176 is in contact with the via 178, the via 174 is in contact with the metal layer 176, the metal layer 184 is in contact with the via 174, the via 172 is in contact with the metal layer 184, the metal layer 170 is in contact with the via 172, the via 168 is in contact with the metal layer 170, the metal layer 166 is in contact with the via 168, or the metal layer 188 is in contact with the metal layer 166. Other structures and/or configurations of vias and/or metal layers of the protective ring 108 relative to other elements, features, etc. are within the scope of the present disclosure.

In some embodiments, at least one of the vias 182, 178, 174, 172, or 168 is formed by at least one of PVD, sputtering, CVD, PECVD, LPCVD, ALCVD, UHVCVD, RPCVD, ALD, MBE, LPE, spin on, growth, or other suitable techniques. In some embodiments, at least one of the metal layers 180, 176, 184, 170, 166, or 188 is formed by at least one of PVD, sputtering, CVD, PECVD, LPCVD, ALCVD, UHVCVD, RPCVD, ALD, MBE, LPE, spin on, growth, or other suitable techniques. According to some embodiments, at least some of the metal layers 180, 176, 184, 170, 166, or 188 have a same width. In some embodiments, at least some of the metal layers 180, 176, 184, 170, 166, or 188 have different widths. In some embodiments, at least some of the metal layers 180, 176, 184, 170, 166, or 188 have a same height. In some embodiments, at least some of the metal layers 180, 176, 184, 170, 166, or 188 have different heights. In some embodiments, at least some of the vias 182, 178, 174, 172, or 168 have a same width. In some embodiments, at least some of the vias 182, 178, 174, 172, or 168 have different widths. In some embodiments, at least some of the vias 182, 178, 174, 172, or 168 have a same height. In some embodiments, at least some of the vias 182, 178, 174, 172, or 168 have different heights.

According to some embodiments, a width of at least some of the metal layers 180, 176, 184, 170, 166, or 188 is different than a width of at least some of the vias 182, 178, 174, 172, or 168. In some embodiments, a width of at least some of the metal layers 180, 176, 184, 170, 166, or 188 is the same as a width of at least some of the vias 182, 178, 174, 172, or 168. In some embodiments, a height of at least some of the metal layers 180, 176, 184, 170, 166, or 188 is different than a height of at least some of the vias 182, 178, 174, 172, or 168. In some embodiments, a height of at least some of the metal layers 180, 176, 184, 170, 166, or 188 is the same as a height of at least some of the vias 182, 178, 174, 172, or 168.

In some embodiments, at least one of a metal layer or a via of the protective ring 108, such as at least one of the metal layers 180, 176, 184, 170, 166, or 188 or the vias 182, 178, 174, 172, or 168, is formed by at least one of lithography, PVD, sputtering, CVD, PECVD, LPCVD, ALCVD, UHVCVD, RPCVD, ALD, MBE, LPE, spin on, growth, or other suitable techniques. In the lithography, a light sensitive material, such as a photoresist is formed over a layer to be patterned. Properties, such as solubility, of the photoresist are affected by the light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed via application of the solvent during development. Thus, a pattern formed in the positive photoresist is a positive image of opaque regions of the template between the light source and the positive photoresist. According to some embodiments, an etchant has a selectivity such that the etchant removes or etches away the layer under the photoresist at a greater rate than the etchant removes or etches away the photoresist. Accordingly, an opening in the photoresist allows the etchant to form a corresponding opening in the layer under the photoresist, and thereby transfer a pattern in the photoresist to the layer under the photoresist. The pattern in the layer under the photoresist is filled with one or more materials to form one or more elements, features, etc. and the patterned photoresist is stripped or washed away at least one of before or after the pattern in the layer under the photoresist is filled with the one or more materials. In some embodiments, a damascene process, such as a single damascene process or a dual damascene process, is used to form at least one of a metal layer or a via of the protective ring 108, such as at least one of the metal layers 180, 176, 184, 170, 166, or 188 or the vias 182, 178, 174, 172, or 168.

In some embodiments, at least one of (i) the via 182 is formed in the second semiconductor layer 162, (ii) the first dielectric layer 158 is formed and the metal layer 180 is formed in the first dielectric layer 158, (iii) the second dielectric layer 154 is formed and the metal layer 176 and the via 178 are formed in the second dielectric layer 154, (iv) the third dielectric layer 150 is formed and the metal layer 184 and the via 174 are formed in the third dielectric layer 150, (v) the fourth dielectric layer 146 is formed and the metal layer 170 and the via 172 are formed in the fourth dielectric layer 146, (vi) the fifth dielectric layer 142 is formed and the metal layer 166 and the via 168 are formed in the fifth dielectric layer 142, or (vii) at least one of the first passivation layer 140 or the third semiconductor layer 138 is formed and the metal layer 188 is formed in at least one of the first passivation layer 140 or the third semiconductor layer 138.

In some embodiments, the protective ring 108 is discontinuous in that one or more intervening dielectric layers do not include at least one of a metal layer or a via of the protective ring 108. In some embodiments, the protective ring 108 is continuous in that intervening dielectric layers include at least one of a metal layer or a via of the protective ring 108. In some embodiments, at least one of a metal layer or a via is formed prior to at least some of a surrounding dielectric layer, such as at least one of at least some of the first dielectric layer 158, at least some of the second dielectric layer 154, at least some of the third dielectric layer 150, at least some of the fourth dielectric layer 146, or at least some of the fifth dielectric layer 142.

In some embodiments, at least some of a layer is formed and patterned to form the via 182 and then at least some of the second semiconductor layer 162 is formed around the via 182 such that at least some of the via 182 is in the second semiconductor layer 162. In some embodiments, at least some of a layer is formed and patterned to form the metal layer 180 and then at least some of the first dielectric layer 158 is formed around the metal layer 180 such that at least some of the metal layer 180 is in the first dielectric layer 158. In some embodiments, at least some of a layer is formed and patterned to form the via 178 and then at least some of the second dielectric layer 154 is formed around the via 178 such that at least some of the via 178 is in the second dielectric layer 154. In some embodiments, at least some of a layer is formed and patterned to form the metal layer 176 and then at least some of the second dielectric layer 154 is formed around the metal layer 176 such that at least some of the metal layer 176 is in the second dielectric layer 154. In some embodiments, at least some of a layer is formed and patterned to form the via 174 and then at least some of the third dielectric layer 150 is formed around the via 174 such that at least some of the via 174 is in the third dielectric layer 150. In some embodiments, at least some of a layer is formed and patterned to form the metal layer 184 and then at least some of the third dielectric layer 150 is formed around the metal layer 184 such that at least some of the metal layer 184 is in the third dielectric layer 150. In some embodiments, at least some of a layer is formed and patterned to form the via 172 and then at least some of the fourth dielectric layer 146 is formed around the via 172 such that at least some of the via 172 is in the fourth dielectric layer 146. In some embodiments, at least some of a layer is formed and patterned to form the metal layer 170 and then at least some of the fourth dielectric layer 146 is formed around the metal layer 170 such that at least some of the metal layer 170 is in the fourth dielectric layer 146. In some embodiments, at least some of a layer is formed and patterned to form the via 168 and then at least some of the fifth dielectric layer 142 is formed around the via 168 such that at least some of the via 168 is in the fifth dielectric layer 142. In some embodiments, at least some of a layer is formed and patterned to form the metal layer 166 and then at least some of the fifth dielectric layer 142 is formed around the metal layer 166 such that at least some of the metal layer 166 is in the fifth dielectric layer 142. In some embodiments, at least some of a layer is formed and patterned to form the metal layer 188 and then at least some of the first passivation layer 140 and at least some of the third semiconductor layer 138 are formed around the metal layer 188 such that at least some of the metal layer 188 is in the first passivation layer 140 and the third semiconductor layer 138.

In some embodiments, at least one of the metal layers 180, 176, 184, 170, 166, or 188 comprises at least one of a metal, a metal alloy, or other suitable material. In some embodiments, at least one of the metal layers 180, 176, 184, 170, 166, or 188 comprises at least one of copper, aluminum, tin, nickel, gold, silver, tungsten, TaN, $Al_2O_3$, $ZrO_2$, or other suitable material. In some embodiments, at least some of the metal layers 180, 176, 184, 170, 166, or 188 have different compositions as compared to other metal layers. In some embodiments, at least one of the vias 182, 178, 174, 172, or 168 comprises at least one of a metal, a metal alloy, or other suitable material. In some embodiments, at least one of the vias 182, 178, 174, 172, or 168 comprises at least one of copper, aluminum, tin, nickel, gold, silver, tungsten, TaN, AL2O3, ZrO2, or other suitable material. In some embodiments, at least some of the vias 182, 178, 174, 172, or 168 have different compositions as compared to other vias. In some embodiments, at least one of (i) the via 182 comprises tungsten, (ii) at least one of the metal layer 180, the via 178, the metal layer 176, the via 174, the metal layer 184, the via 172, the metal layer 170, the via 168, or the metal layer 166 comprises copper, or (iii) the metal layer 188 comprises aluminum. In some embodiments, at least some of the one or more conductive structures 118 have a same composition as at least one of at least some of the metal layers 180, 176, 184, 170, 166, or 188 or at least some of the vias 182, 178, 174, 172, or 168.

In some embodiments, the protective ring 108 comprises a first portion 192, a second portion 194 at a higher elevation than the first portion 192, and a third portion between the first portion 192 and the second portion 194. In some embodiments, the first portion 192 of the protective ring 108 laterally surrounds the first area 102 and/or the one or more conductive structures 118 (shown in FIG. 1A), such as where the first portion 192 extends across a circumference of the protective ring 108. In some embodiments, the first portion 192 of the protective ring 108 is discontinuous or has a break so as to laterally surround, encircle, etc. some but not all of the first area 102 and/or the one or more conductive structures 118. In some embodiments, the first portion 192 of the protective ring 108 is continuous so as to laterally surround, encircle, etc. all of the first area 102 and/or the one or more conductive structures 118. In some embodiments, the first portion 192 comprises at least one of the via 182, the metal layer 180, the via 178, the metal layer 176, or the via 174.

In some embodiments, the second portion 194 of the protective ring 108 laterally surrounds the first area 102 (shown in FIG. 1A) and/or the one or more conductive structures 118, such as where the second portion 194 extends across the circumference of the protective ring 108. In some embodiments, the second portion 194 of the protective ring 108 is discontinuous or has a break so as to laterally surround, encircle, etc. some but not all of the first area 102 and/or the one or more conductive structures 118. In some embodiments, the second portion 194 of the protective ring 108 is continuous so as to laterally surround, encircle, etc. all of the first area 102 and/or the one or more conductive structures 118. In some embodiments, the second portion 194 comprises at least one of the via 172, the metal layer 170, the via 168, the metal layer 166, or the metal layer 188.

In some embodiments, the third portion of the protective ring 108 laterally surrounds the first area 102 (shown in FIG. 1A) and/or the one or more conductive structures 118, such as where the third portion extends across the circumference of the protective ring 108. In some embodiments, the third portion of the protective ring 108 is discontinuous or has a break so as to laterally surround, encircle, etc. some but not all of the first area 102 and/or the one or more conductive structures 118. In some embodiments, the third portion of the protective ring 108 is continuous so as to laterally surround, encircle, etc. all of the first area 102 and/or the one or more conductive structures 118. In some embodiments, the third portion comprises the metal layer 184.

In some embodiments, the first portion 192 of the protective ring 108 is not vertically coincident with the second portion 194 of the protective ring 108 in one or more first regions of the protective ring 108. For example, in the one or more first regions of the protective ring 108, the first portion 192 is laterally offset from the second portion 194 such that a vertical line, such as a line orthogonal to a plane within which a greatest extent of a layer of the semiconductor device 100 lies, does not intersect both the first portion 192 and the second portion 194. In some embodiments, a vertical line is parallel to a y-axis shown in FIG. 1B.

In some embodiments, the third portion, such as the metal layer 184, is vertically coincident with the first portion 192 and the second portion 194 in the one or more first regions of the protective ring 108. In some embodiments, the third portion is vertically coincident with the first portion 192 and the second portion 194 in the entirety of the protective ring 108. In some embodiments, a first section 184a of the metal layer 184 is vertically coincident with the first portion 192 but is not vertically coincident with the second portion 194. In some embodiments, the first section 184a of the metal layer 184 is in contact with the first portion 192. In some embodiments, a second section 184b of the metal layer 184 is vertically coincident with the second portion 194 but is not vertically coincident with the first portion 192. In some embodiments, the second section 184b of the metal layer 184 is in contact with the second portion 194.

In some embodiments, the one or more first regions comprise an entirety of the protective ring 108, and the first portion 192 of the protective ring 108 is not vertically coincident with the second portion 194 of the protective ring 108 in any region of the protective ring 108.

In some embodiments, the one or more first regions do not comprise an entirety of the protective ring 108, and the first portion 192 of the protective ring 108 is vertically coincident with the second portion 194 in one or more second regions of the protective ring 108. In some embodiments, the one or more first regions in which the first portion 192 is not vertically coincident with the second portion 194 comprise at least some of the first corner region 104, at least some of the second corner region 106, at least some of the third corner region 126, and/or at least some of the fourth corner region 124. In some embodiments, the one or more second regions in which the first portion 192 is vertically coincident with the second portion 194 comprise at least some of the first wall 110, at least some of the second wall 122, at least some of the third wall 114, and/or at least some of the fourth wall 116.

In some embodiments, the first portion 192 of the protective ring 108 extends from a lowest elevation corresponding to y-axis position $y_1$ on the y-axis to a highest elevation corresponding to y-axis position $y_2$ on the y-axis. In some embodiments, the second portion 194 of the protective ring 108 extends from a lowest elevation corresponding to y-axis position $y_3$ to a highest elevation corresponding to y-axis position $y_4$. In some embodiments, the first portion 192 comprises an entirety of a section of the protective ring 108 that exists between y-axis position $y_1$ and y-axis position $y_2$. In some embodiments, the second portion 194 comprises an entirety of a section of the protective ring 108 that exists between y-axis position $y_3$ and y-axis position $y_4$. Thus, in accordance with some embodiments, in the one or more first regions of the protective ring 108, the entirety of the section of the protective ring 108 that exists between y-axis position $y_1$ and y-axis position $y_2$ is not vertically coincident with the entirety of the section of the protective ring 108 that exists between y-axis position $y_3$ and y-axis position $y_4$ such that, in the one or more first regions, a vertical line does not intersect with both the section of the protective ring 108 between y-axis position $y_1$ and y-axis position $y_2$ and the section of the protective ring 108 between y-axis position $y_3$ and y-axis position $y_4$.

In some embodiments, the first portion 192 of the protective ring 108 extends from x-axis position $x_1$ on an x-axis shown in FIG. 1B to x-axis position $x_2$ on the x-axis. In some embodiments, the second portion 194 of the protective ring 108 extends from x-axis position $x_3$ to x-axis position $x_4$. In some embodiments, a distance 196 between x-axis position $x_1$ and x-axis position $x_3$ corresponds to a width of the first portion 192, such as a width of a metal layer of the first portion 192, such as at least one of the metal layer 180 or the metal layer 176. In some embodiments, a distance 197 between x-axis position $x_2$ associated with the first portion 192 and x-axis position $x_3$ associated with the second portion 194 corresponds to a first lateral offset between the first portion 192 and the second portion 194 in at least some of the fourth corner region 124. In some embodiments, a distance 198 between x-axis position $x_3$ and x-axis position $x_4$ corresponds to a width of the second portion 194, such as a width of a metal layer of the second portion 194, such as at least one of the metal layer 170, the metal layer 166, or the metal layer 188. In some embodiments, the distance 196 corresponding to the width of the first portion 192 is about equal to the distance 198 corresponding to the width of the second portion 194. In some embodiments, the distance 196 corresponding to the width of the first portion 192 is different than the distance 198 corresponding to the width of the second portion 194. In some embodiments, the distance 197 corresponding to the first lateral offset is about equal to at least one of the distance 196 corresponding to the width of the first portion 192 or the distance 198 corresponding to the width of the second portion 194. The distance 197 corresponding to the first lateral offset is smaller than at least one of the distance 196 corresponding to the width of the first portion 192 or the distance 198 corresponding to the width of the second portion 194. In some embodiments, the distance 197 corresponding to the first lateral offset is larger than at least one of the distance 196 corresponding to the width of the first portion 192 or the distance 198 corresponding to the width of the second portion 194. The distance 197 is larger than 0.1 micrometers. Other values of the distance 197 are within the scope of the present disclosure.

In some embodiments, due to the protective ring 108 having the first lateral offset, distances between the protective ring 108 and one or more other layers, features, etc. other than the protective ring 108 are different at different elevations of the protective ring 108. In some embodiments, a distance between x-axis position $x_2$ (shown in FIG. 1B) associated with the first portion 192 of the protective ring 108 and a conductive structure 118 in the first area 102 (shown in FIG. 1A) is different than a distance between x-axis position $x_4$ (shown in FIG. 1B) associated with the second portion 194 of the protective ring 108 and the (same) conductive structure 118.

In some embodiments, at least one of the dielectric layers 158, 154, 150, 146, or 142 has a thickness between about 0.5 micrometers to about 50 micrometers. In some embodiments, a height of the protective ring 108 is between about 5 micrometers to about 50 micrometers. In some embodiments, the height of the protective ring 108 corresponds to a distance between y-axis position $y_1$ and y-axis position $y_4$.

In some embodiments, implementing the first lateral offset between the first portion 192 of the protective ring 108 and the second portion 194 of the protective ring 108 reduces an amount of stress on one or more portions of the semiconductor device 100. In some embodiments, the stress comprises at least one of stress induced by thermal expansion of the protective ring, stress due to differences in thermal properties between the protective ring and surrounding material, stress induced by thermal stress associated with other materials in the chip, or thermal stress induced by gap fill material of a gap fill structure, such as at least one of gap fill structures 504, 505, 590, 591, or 592 of FIG. 5. In some embodiments, in a chip comprising a protective ring that extends vertically in a single vertical axis, stress associated with the protective ring is concentrated in a single direction and/or along the single vertical axis, which can cause at least one of film delamination, peeling, etc. of the chip. In some embodiments, implementing the first lateral offset between the first portion 192 and the second portion 194 provides for a more uniform distribution of stress in the semiconductor device 100. In some embodiments, rather than the stress being concentrated in the single direction and/or along the single vertical axis, the stress is released and/or scattered in multiple directions and/or multiple regions, such as along directions corresponding to at least some of arrows 107, 109, 111, 113, 115, 117, 119, or 121 in FIGS. 1A and 1B, thereby reducing the amount of stress induced in a single region of the semiconductor device 100. In some embodiments, reducing the amount of stress protects the semiconductor device 100 from at least one of damage, wafer defects, film delamination, peeling, etc.

The view depicted in FIG. 1C includes a cross-section of the third wall 114 of the protective ring 108 in accordance with some embodiments in which, in at least some of the third wall 114 of the protective ring 108, the first portion 192 of the protective ring 108 is laterally offset from the second portion 194 of the protective ring 108 such that a vertical line does not intersect both the first portion 192 and the second portion 194. In some embodiments, a distance by which the first portion 192 of the protective ring 108 is laterally offset from the second portion 194 of the protective ring 108 varies in different regions of the protective ring 108. In some embodiments, a distance 199 between x-axis position $x_5$ associated with the first portion 192 and x-axis position $x_7$ associated with the second portion 194 corresponds to a second lateral offset between the first portion 192 and the second portion 194 in at least some of the third wall 114. The distance 197 (shown in FIG. 1B) corresponding to the first lateral offset in the fourth corner region 124 is different than, such as larger than, the distance 199 (shown in FIG. 1C) corresponding to the second lateral offset in the third wall 114. In some embodiments, the distance 197 corresponding to the first lateral offset is about equal to the distance 199 corresponding to the second lateral offset.

Figure 2A:
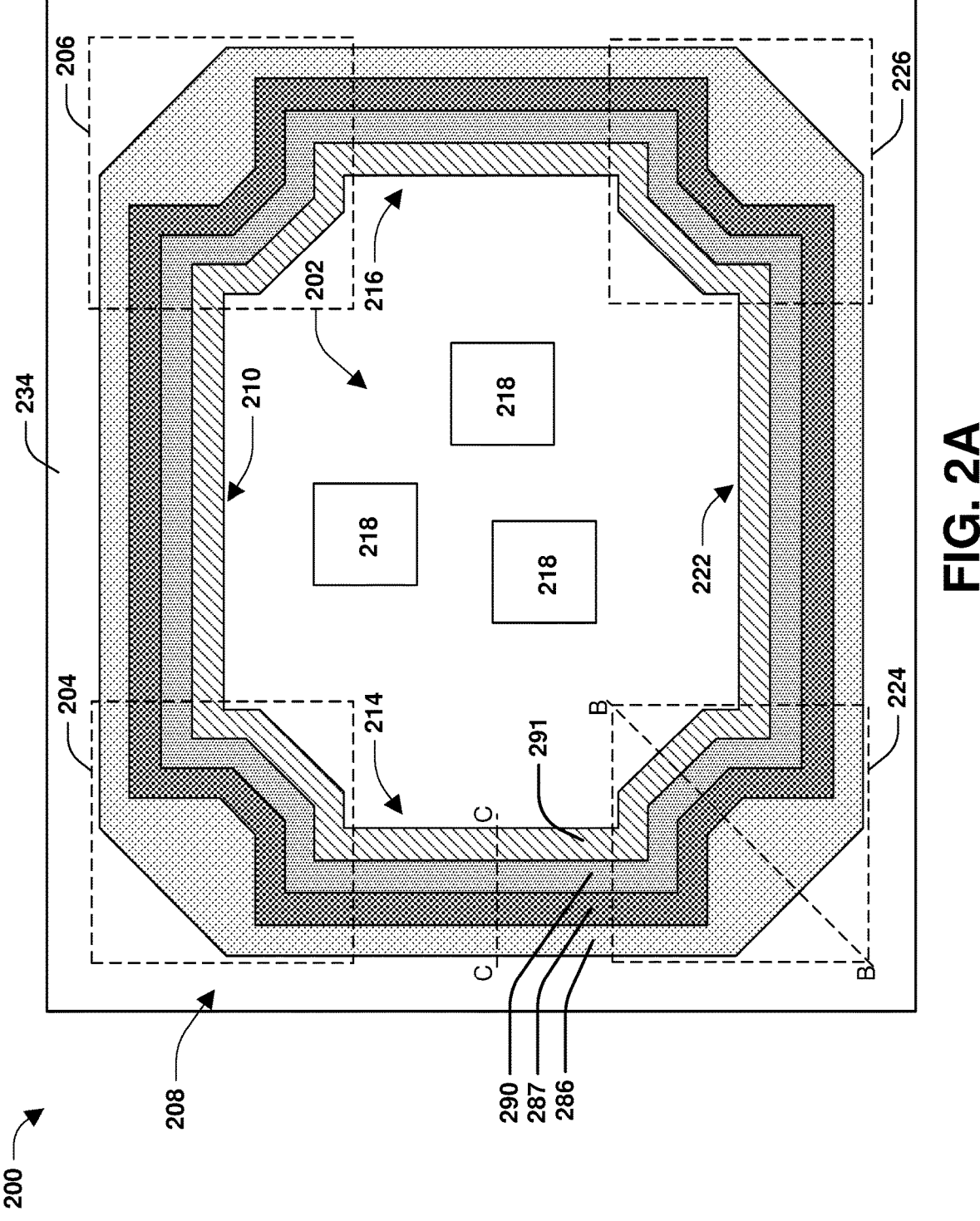
FIG. 2A illustrates a top view of a semiconductor device in accordance with some embodiments.
Figure 2B:
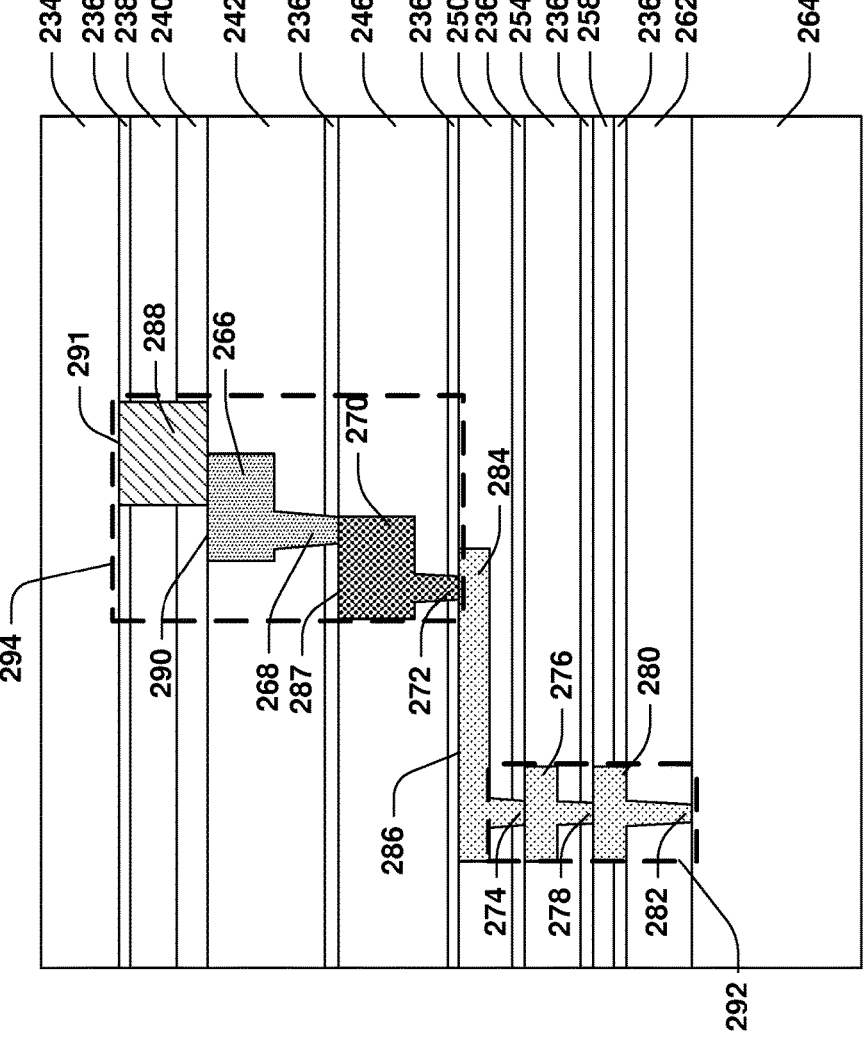
FIG. 2B illustrates a cross-sectional view of a semiconductor device in accordance with some embodiments.
Figure 2C:
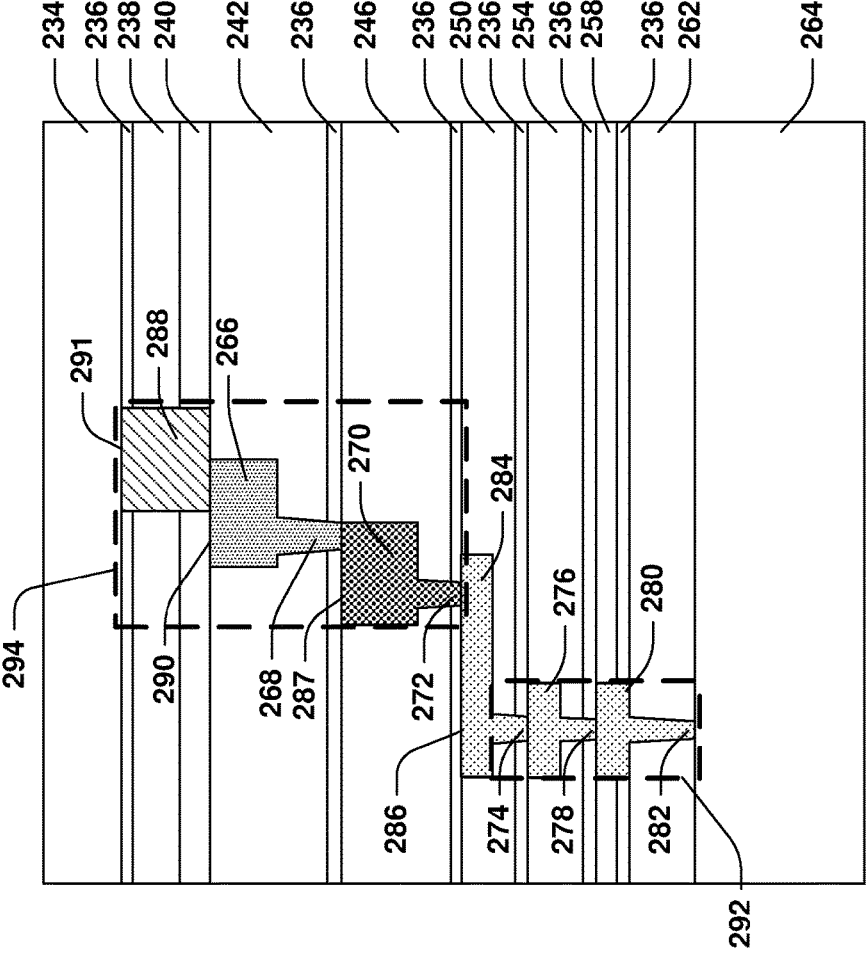
FIG. 2C illustrates a cross-sectional view of a semiconductor device in accordance with some embodiments.

FIGS. 2A-2C illustrate a semiconductor device 200 according to some embodiments. FIG. 2A illustrates a top view of the semiconductor device 200. FIG. 2B illustrates a cross-sectional view of the semiconductor device 200 taken along lines B-B of FIG. 2A. FIG. 2C illustrates a cross-sectional view of the semiconductor device 200 taken along lines C-C of FIG. 2A.

The semiconductor device 200 comprises a protective ring 208, such as at least one of a seal ring, a guard ring, etc. In some embodiments, the protective ring 208 laterally surrounds at least one of a first area 202 or one or more conductive structures 218 in the first area 202. In some embodiments, the protective ring 208 is discontinuous or has a break so as to laterally surround, encircle, etc. some but not all of the first area 202 and/or the one or more conductive structures 218. In some embodiments, the protective ring 208 is continuous so as to laterally surround, encircle, etc. all of the first area 202 and/or the one or more conductive structures 218.

In some embodiments, the semiconductor device 200 comprises a first semiconductor layer 234 overlying the protective ring 208. For ease of illustration, layers, features, elements, etc. overlying the protective ring 208 and/or the one or more conductive structures 218 are removed in FIG. 2A to show a top view of the protective ring 208 and/or the one or more conductive structures 218. In accordance with some embodiments, a top surface 286 of a metal layer 284 (shown in FIGS. 2B and 2C) of the protective ring 208, a top surface 287 of a metal layer 270 (shown in FIGS. 2B and 2C), a top surface 290 of a metal layer 266 (shown in FIGS. 2B and 2C) of the protective ring 208, and a top surface 291 of a metal layer 288 (shown in FIGS. 2B and 2C) are depicted in FIG. 2A. In some embodiments, the top surface 286, the top surface 287, the top surface 290, and the top surface 291 are at different elevations.

In some embodiments, the one or more conductive structures 218 have one or more of the features, characteristics, relationships, etc. provided herein with respect to the one or more conductive structures 118 of FIGS. 1A-1C.

In some embodiments, the protective ring 208 comprises a first wall 210, a second wall 222 opposing the first wall 210, a third wall 214, and a fourth wall 216 opposing the third wall 214. At least some of the one or more conductive structures 218 are between the first wall 210 and the second wall 222, and at least some of the one or more conductive structures 218 are between the third wall 214 and the fourth wall 216. In some embodiments, the protective ring 208 comprises at least one of a first corner region 204 separating the first wall 210 from the third wall 214, a second corner region 206 separating the fourth wall 216 from the first wall 210, a third corner region 226 separating the second wall 222 from the fourth wall 216, or a fourth corner region 224 separating the third wall 214 from the second wall 222. Other structures and/or configurations of walls and/or corner regions of the protective ring 208 relative to other elements, features, etc. are within the scope of the present disclosure.

According to some embodiments, the protective ring 208 at least one of protects, shields, electrically isolates, etc. at least one of the semiconductor device 200, the one or more conductive structures 218, or one or more other layers, features, etc. of the semiconductor device 200. In some embodiments, the protective ring 208 provides support, reinforcement, structural integrity, etc. for at least one of the semiconductor device 200, the one or more conductive structures 218, or one or more other layers, features, etc. of the semiconductor device 200.

The view depicted in FIG. 2B includes a cross-section of the fourth corner region 224 of the protective ring 208, in accordance with some embodiments. In some embodiments, the semiconductor device 200 comprises at least one of a substrate 264, a second semiconductor layer 262 over the substrate 264, a first dielectric layer 258 over the second semiconductor layer 262, a second dielectric layer 254 over the first dielectric layer 258, a third dielectric layer 250 over the second dielectric layer 254, a fourth dielectric layer 246 over the third dielectric layer 250, a fifth dielectric layer 242 over the fourth dielectric layer 246, a first passivation layer 240 over the fifth dielectric layer 242, a third semiconductor layer 238 over the first passivation layer 240, or the first semiconductor layer 234 over the third semiconductor layer 238. In some embodiments, at least one of the substrate 264, the second semiconductor layer 262, the first dielectric layer 258, the second dielectric layer 254, the third dielectric layer 250, the fourth dielectric layer 246, the fifth dielectric layer 242, the first passivation layer 240, the third semiconductor layer 238, or the first semiconductor layer 234 have one or more of the features, characteristics, relationships, etc. provided herein with respect to at least one of the substrate 164, the second semiconductor layer 162, the first dielectric layer 158, the second dielectric layer 154, the third dielectric layer 150, the fourth dielectric layer 146, the fifth dielectric layer 142, the first passivation layer 140, the third semiconductor layer 138, or the first semiconductor layer 134 of FIGS. 1A-1C, respectively. In some embodiments, one, some and/or all layers of the semiconductor device 200 are formed using one or more of the techniques provided herein with respect to FIGS. 1A-1C.

In some embodiments, the semiconductor device 200 comprises one or more etch stop layers 236, such as between adjacent layers of the semiconductor device 200. In some embodiments, the one or more etch stop layers 236 have one or more of the features, characteristics, relationships, etc. provided herein with respect to the one or more etch stop layers 136 of FIGS. 1A-1C. In some embodiments, the one or more etch stop layers 236 are formed using one or more of the techniques provided herein with respect to forming the one or more etch stop layers 136 of FIGS. 1A-1C.

In some embodiments, the protective ring 208 is provided within one or more first dielectric layers of the semiconductor device 200. For example, according to some embodiments, the protective ring 208 extends through at least some of the one or more first dielectric layers and/or through at least some of one or more other layers of the semiconductor device 200. In some embodiments, the one or more first dielectric layers comprise at least one of the dielectric layers 258, 254, 250, 246, or 242. According to some embodiments, the protective ring 208 includes alternating layers of a metal layer and a via. In some embodiments, the protective ring 208 comprises at least one of a via 282, a metal layer 280 overlying the via 282, a via 278 overlying the metal layer 280, a metal layer 276 overlying the via 278, a via 274 overlying the metal layer 276, the metal layer 284 overlying the via 274, a via 272 overlying the metal layer 284, the metal layer 270 overlying the via 272, a via 268 overlying the metal layer 270, the metal layer 266 overlying the via 268, or the metal layer 288 overlying the metal layer 266. In some embodiments, a metal layer or via of the protective ring 208 is in contact with, such as in direct contact with, an adjacent via or metal layer. In some embodiments, at least one of the metal layer 280 is in contact with the via 282, the via 278 is in contact with the metal layer 280, the metal layer 276 is in contact with the via 278, the via 274 is in contact with the metal layer 276, the metal layer 284 is in contact with the via 274, the via 272 is in contact with the metal layer 284, the metal layer 270 is in contact with the via 272, the via 268 is in contact with the metal layer 270, the metal layer 266 is in contact with the via 268, or the metal layer 288 is in contact with the metal layer 266. Other structures and/or configurations of vias and/or metal layers of the protective ring 208 relative to other elements, features, etc. are within the scope of the present disclosure.

In some embodiments, vias and/or metal layers of the protective ring 208 have one or more of the features, characteristics, relationships, etc. provided herein with respect to vias and/or metal layers of the protective ring 108 of FIGS. 1A-1C. In some embodiments, vias and/or metal layers of the protective ring 208 are formed using one or more of the techniques provided herein with respect to forming vias and/or metal layers of the protective ring 108 of FIGS. 1A-1C.

In some embodiments, the protective ring 208 is discontinuous in that one or more intervening dielectric layers do not include at least one of a metal layer or a via of the protective ring 208. In some embodiments, the protective ring 208 is continuous in that intervening dielectric layers include at least one of a metal layer or a via of the protective ring 208.

In some embodiments, at least one of the metal layers 280, 276, 284, 270, 266, or 288 comprises at least one of a metal, a metal alloy, or other suitable material. In some embodiments, at least one of the metal layers 280, 276, 284, 270, 266, or 288 comprises at least one of copper, aluminum, tin, nickel, gold, silver, tungsten, TaN, $AL_2O_3$, $ZrO_2$, or other suitable material. In some embodiments, at least some of the metal layers 280, 276, 284, 270, 266, or 288 have different compositions as compared to other metal layers. In some embodiments, at least one of the vias 282, 278, 274, 272, or 268 comprises at least one of a metal, a metal alloy, or other suitable material. In some embodiments, at least one of the vias 282, 278, 274, 272, or 268 comprises at least one of copper, aluminum, tin, nickel, gold, silver, tungsten, TaN, $AL_2O_3$, $ZrO_2$, or other suitable material. In some embodiments, at least some of the vias 282, 278, 274, 272, or 268 have different compositions as compared to other vias. In some embodiments, at least one of (i) the via 282 comprises tungsten, (ii) at least one of the metal layer 280, the via 278, the metal layer 276, the via 274, the metal layer 284, the via 272, the metal layer 270, the via 268, or the metal layer 266 comprises copper, or (iii) the metal layer 288 comprises aluminum. In some embodiments, at least some of the one or more conductive structures 218 have a same composition as at least one of at least some of the metal layers 280, 276, 284, 270, 266, or 288 or at least some of the vias 282, 278, 274, 272, or 268.

In some embodiments, the protective ring 208 comprises a first portion 292, a second portion 294 at a higher elevation than the first portion 292, and a third portion between the first portion 292 and the second portion 294. In some embodiments, the first portion 292 of the protective ring 208 laterally surrounds the first area 202 and/or the one or more conductive structures 218 (shown in FIG. 2A). In some embodiments, the first portion 292 of the protective ring 208 is discontinuous or has a break so as to laterally surround, encircle, etc. some but not all of the first area 202 and/or the one or more conductive structures 218. In some embodiments, the first portion 292 of the protective ring 208 is continuous so as to laterally surround, encircle, etc. all of the first area 202 and/or the one or more conductive structures 218. In some embodiments, the first portion 292 comprises at least one of the via 282, the metal layer 280, the via 278, the metal layer 276, or the via 274.

In some embodiments, the second portion 294 of the protective ring 208 laterally surrounds the first area 202 (shown in FIG. 2A) and/or the one or more conductive structures 218. In some embodiments, the second portion 294 of the protective ring 208 is discontinuous or has a break so as to laterally surround, encircle, etc. some but not all of the first area 202 and/or the one or more conductive structures 218. In some embodiments, the second portion 294 of the protective ring 208 is continuous so as to laterally surround, encircle, etc. all of the first area 202 and/or the one or more conductive structures 218. In some embodiments, the second portion 294 comprises at least one of the via 272, the metal layer 270, the via 268, the metal layer 266, or the metal layer 288.

In some embodiments, the third portion of the protective ring 208 laterally surrounds the first area 202 (shown in FIG. 2A) and/or the one or more conductive structures 218. In some embodiments, the third portion of the protective ring 208 is discontinuous or has a break so as to laterally surround, encircle, etc. some but not all of the first area 202 and/or the one or more conductive structures 218. In some embodiments, the third portion of the protective ring 208 is continuous so as to laterally surround, encircle, etc. all of the first area 202 and/or the one or more conductive structures 218. In some embodiments, the third portion comprises the metal layer 284.

In some embodiments, the first portion 292 of the protective ring 208 is not vertically coincident with the second portion 294 of the protective ring 208 in one or more first regions of the protective ring 208. For example, in the one or more first regions of the protective ring 208, the first portion 292 is laterally offset from the second portion 294 such that a vertical line, such as a line orthogonal to a plane within which a greatest extent of a layer of the semiconductor device 200 lies, does not intersect both the first portion 292 and the second portion 294. In some embodiments, the one or more first regions comprise an entirety of the protective ring 208, and the first portion 292 of the protective ring 208 is not vertically coincident with the second portion 294 of the protective ring 208 in any region of the protective ring 208.

In some embodiments, the one or more first regions do not comprise an entirety of the protective ring 208, and the first portion 292 of the protective ring 208 is vertically coincident with the second portion 294 in one or more second regions of the protective ring 208. In some embodiments, the one or more first regions in which the first portion 292 is not vertically coincident with the second portion 294 comprise at least some of the first corner region 204, at least some of the second corner region 206, at least some of the third corner region 226, and/or at least some of the fourth corner region 224. In some embodiments, the one or more second regions in which the first portion 292 is vertically coincident with the second portion 294 comprise at least some of the first wall 210, at least some of the second wall 222, at least some of the third wall 214, and/or at least some of the fourth wall 216.

The view depicted in FIG. 2C includes a cross-section of the third wall 214 of the protective ring 208 in accordance with some embodiments in which, in at least some of the third wall 214 of the protective ring 208, the first portion 292 of the protective ring 208 is laterally offset from the second portion 294 of the protective ring 208 such that a vertical line does not intersect both the first portion 292 and the second portion 294.

Figure 3A:
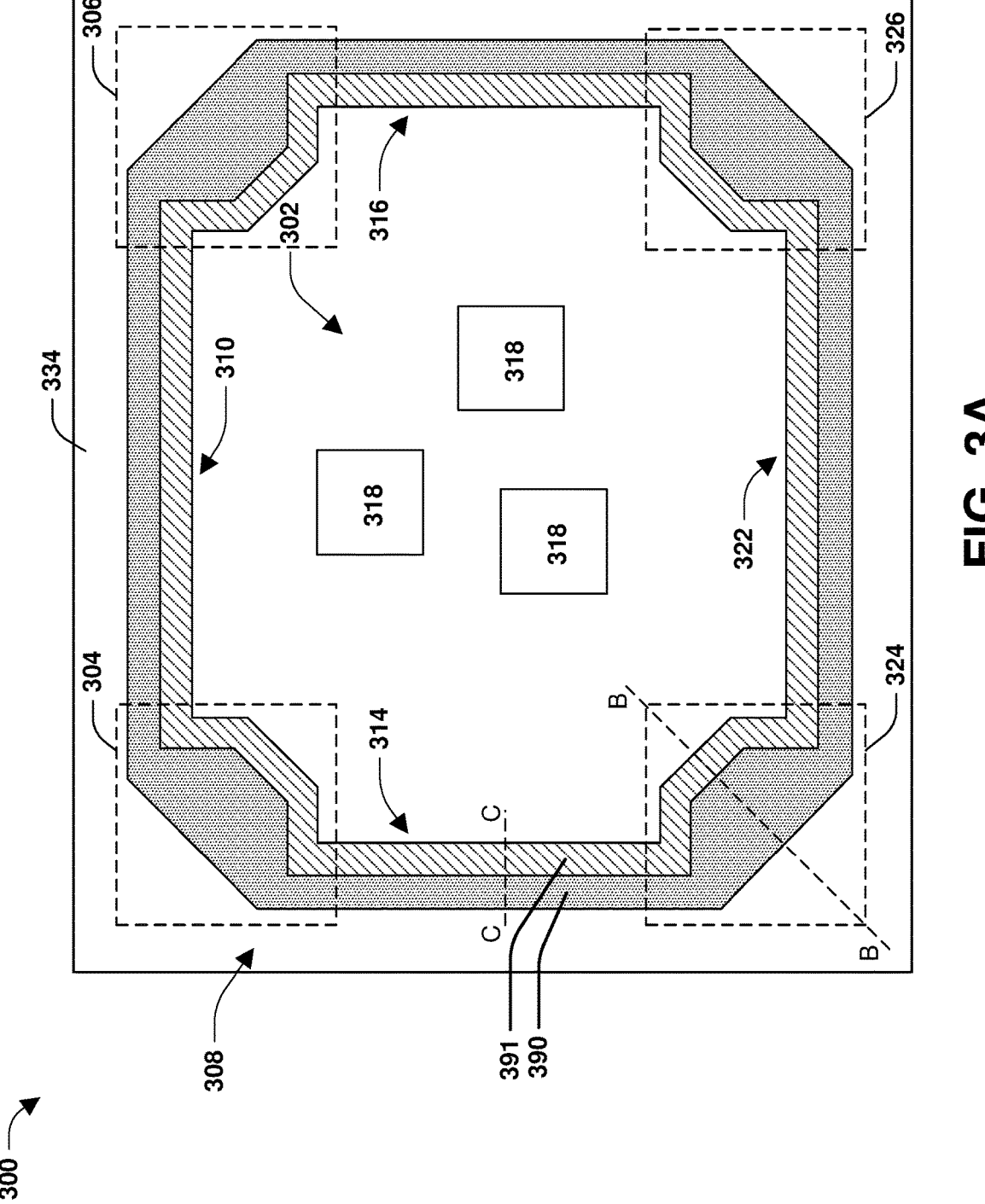
FIG. 3A illustrates a top view of a semiconductor device in accordance with some embodiments.
Figure 3B:
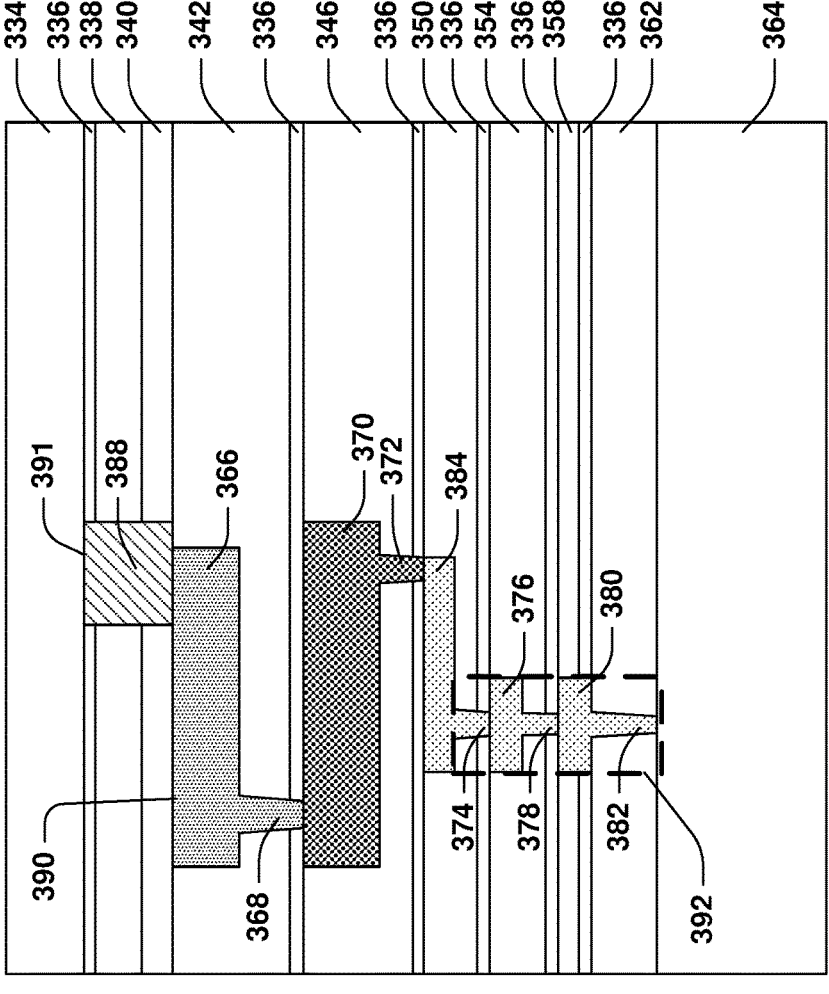
FIG. 3B illustrates a cross-sectional view of a semiconductor device in accordance with some embodiments.
Figure 3C:
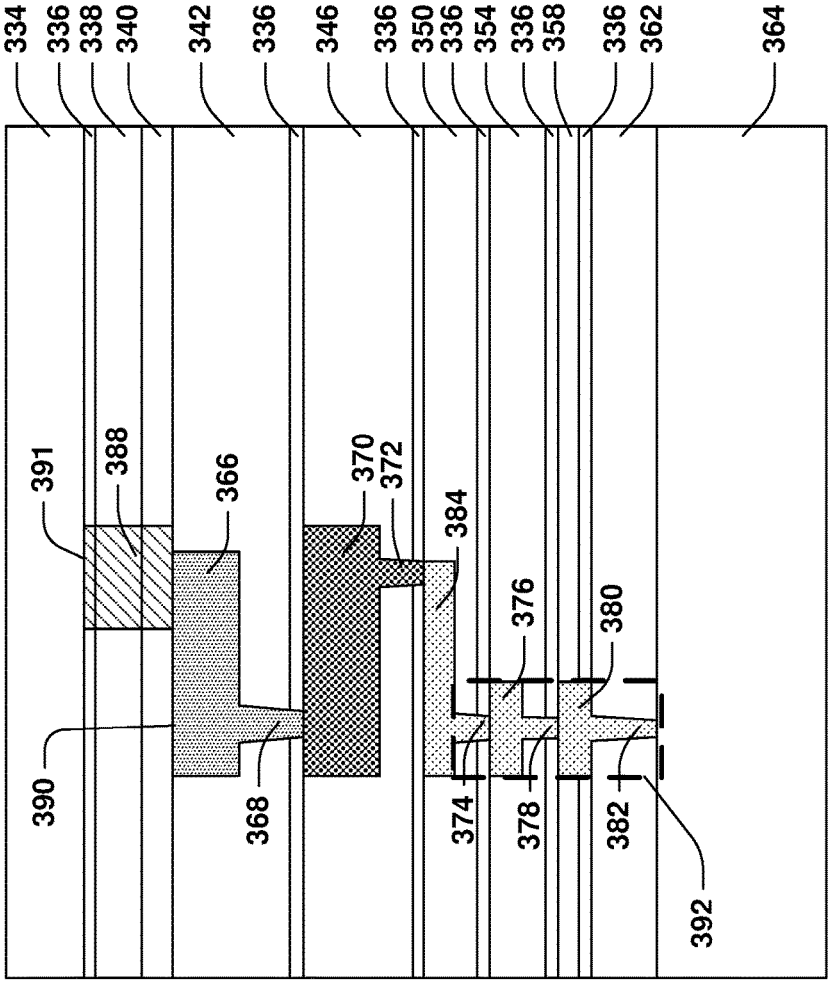
FIG. 3C illustrates a cross-sectional view of a semiconductor device in accordance with some embodiments.

FIGS. 3A-3C illustrate a semiconductor device 300 according to some embodiments. FIG. 3A illustrates a top view of the semiconductor device 300. FIG. 3B illustrates a cross-sectional view of the semiconductor device 300 taken along lines B-B of FIG. 3A. FIG. 3C illustrates a cross-sectional view of the semiconductor device 300 taken along lines C-C of FIG. 3A.

The semiconductor device 300 comprises a protective ring 308, such as at least one of a seal ring, a guard ring, etc. In some embodiments, the protective ring 308 laterally surrounds at least one of a first area 302 or one or more conductive structures 318 in the first area 302. In some embodiments, the protective ring 308 is discontinuous or has a break so as to laterally surround, encircle, etc. some but not all of the first area 302 and/or the one or more conductive structures 318. In some embodiments, the protective ring 308 is continuous so as to laterally surround, encircle, etc. all of the first area 302 and/or the one or more conductive structures 318.

In some embodiments, the semiconductor device 300 comprises a first semiconductor layer 334 overlying the protective ring 308. For ease of illustration, layers, features, elements, etc. overlying the protective ring 308 and/or the one or more conductive structures 318 are removed in FIG. 3A to show a top view of the protective ring 308 and/or the one or more conductive structures 318. In accordance with some embodiments, a top surface 390 of a metal layer 366 (shown in FIGS. 3B and 3C) of the protective ring 308 and a top surface 391 of a metal layer 388 (shown in FIGS. 3B and 3C) are depicted in FIG. 3A. In some embodiments, the top surface 390 and the top surface 391 are at different elevations.

In some embodiments, the one or more conductive structures 318 have one or more of the features, characteristics, relationships, etc. provided herein with respect to the one or more conductive structures 118 of FIGS. 1A-1C.

In some embodiments, the protective ring 308 comprises a first wall 310, a second wall 322 opposing the first wall 310, a third wall 314, and a fourth wall 316 opposing the third wall 314. At least some of the one or more conductive structures 318 are between the first wall 310 and the second wall 322, and at least some of the one or more conductive structures 318 are between the third wall 314 and the fourth wall 316. In some embodiments, the protective ring 308 comprises at least one of a first corner region 304 separating the first wall 310 from the third wall 314, a second corner region 306 separating the fourth wall 316 from the first wall 310, a third corner region 326 separating the second wall 322 from the fourth wall 316, or a fourth corner region 324 separating the third wall 314 from the second wall 322. Other structures and/or configurations of walls and/or corner regions of the protective ring 308 relative to other elements, features, etc. are within the scope of the present disclosure.

According to some embodiments, the protective ring 308 at least one of protects, shields, electrically isolates, etc. at least one of the semiconductor device 300, the one or more conductive structures 318, or one or more other layers, features, etc. of the semiconductor device 300. In some embodiments, the protective ring 308 provides support, reinforcement, structural integrity, etc. for at least one of the semiconductor device 300, the one or more conductive structures 318, or one or more other layers, features, etc. of the semiconductor device 300.

The view depicted in FIG. 3B includes a cross-section of the fourth corner region 324 of the protective ring 308, in accordance with some embodiments. In some embodiments, the semiconductor device 300 comprises at least one of a substrate 364, a second semiconductor layer 362 over the substrate 364, a first dielectric layer 358 over the second semiconductor layer 362, a second dielectric layer 354 over the first dielectric layer 358, a third dielectric layer 350 over the second dielectric layer 354, a fourth dielectric layer 346 over the third dielectric layer 350, a fifth dielectric layer 342 over the fourth dielectric layer 346, a first passivation layer 340 over the fifth dielectric layer 342, a third semiconductor layer 338 over the first passivation layer 340, or the first semiconductor layer 334 over the third semiconductor layer 338. In some embodiments, at least one of the substrate 364, the second semiconductor layer 362, the first dielectric layer 358, the second dielectric layer 354, the third dielectric layer 350, the fourth dielectric layer 346, the fifth dielectric layer 342, the first passivation layer 340, the third semiconductor layer 338, or the first semiconductor layer 334 have one or more of the features, characteristics, relationships, etc. provided herein with respect to at least one of the substrate 164, the second semiconductor layer 162, the first dielectric layer 158, the second dielectric layer 154, the third dielectric layer 150, the fourth dielectric layer 146, the fifth dielectric layer 142, the first passivation layer 140, the third semiconductor layer 138, or the first semiconductor layer 134 of FIGS. 1A-1C, respectively. In some embodiments, one, some and/or all layers of the semiconductor device 300 are formed using one or more of the techniques provided herein with respect to FIGS. 1A-1C.

In some embodiments, the semiconductor device 300 comprises one or more etch stop layers 336, such as between adjacent layers of the semiconductor device 300. In some embodiments, the one or more etch stop layers 336 have one or more of the features, characteristics, relationships, etc. provided herein with respect to the one or more etch stop layers 136 of FIGS. 1A-1C. In some embodiments, the one or more etch stop layers 336 are formed using one or more of the techniques provided herein with respect to forming the one or more etch stop layers 136 of FIGS. 1A-1C.

In some embodiments, the protective ring 308 is provided within one or more first dielectric layers of the semiconductor device 300. For example, according to some embodiments, the protective ring 308 extends through at least some of the one or more first dielectric layers and/or through at least some of one or more other layers of the semiconductor device 300. In some embodiments, the one or more first dielectric layers comprise at least one of the dielectric layers 358, 354, 350, 346, or 342. According to some embodiments, the protective ring 308 includes alternating layers of a metal layer and a via. In some embodiments, the protective ring 308 comprises at least one of a via 382, a metal layer 380 overlying the via 382, a via 378 overlying the metal layer 380, a metal layer 376 overlying the via 378, a via 374 overlying the metal layer 376, a metal layer 384 overlying the via 374, a via 372 overlying the metal layer 384, the metal layer 370 overlying the via 372, a via 368 overlying the metal layer 370, the metal layer 366 overlying the via 368, or the metal layer 388 overlying the metal layer 366. In some embodiments, a metal layer or via of the protective ring 308 is in contact with, such as in direct contact with, an adjacent via or metal layer. In some embodiments, at least one of the metal layer 380 is in contact with the via 382, the via 378 is in contact with the metal layer 380, the metal layer 376 is in contact with the via 378, the via 374 is in contact with the metal layer 376, the metal layer 384 is in contact with the via 374, the via 372 is in contact with the metal layer 384, the metal layer 370 is in contact with the via 372, the via 368 is in contact with the metal layer 370, the metal layer 366 is in contact with the via 368, or the metal layer 388 is in contact with the metal layer 366. Other structures and/or configurations of vias and/or metal layers of the protective ring 308 relative to other elements, features, etc. are within the scope of the present disclosure.

In some embodiments, vias and/or metal layers of the protective ring 308 have one or more of the features, characteristics, relationships, etc. provided herein with respect to vias and/or metal layers of the protective ring 108 of FIGS. 1A-1C. In some embodiments, vias and/or metal layers of the protective ring 308 are formed using one or more of the techniques provided herein with respect to forming vias and/or metal layers of the protective ring 108 of FIGS. 1A-1C.

In some embodiments, the protective ring 308 is discontinuous in that one or more intervening dielectric layers do not include at least one of a metal layer or a via of the protective ring 308. In some embodiments, the protective ring 308 is continuous in that intervening dielectric layers include at least one of a metal layer or a via of the protective ring 308.

In some embodiments, at least one of the metal layers 380, 376, 384, 370, 366, or 388 comprises at least one of a metal, a metal alloy, or other suitable material. In some embodiments, at least one of the metal layers 380, 376, 384, 370, 366, or 388 comprises at least one of copper, aluminum, tin, nickel, gold, silver, tungsten, TaN, $Al_2O_3$, $ZrO_2$, or other suitable material. In some embodiments, at least some of the metal layers 380, 376, 384, 370, 366, or 388 have different compositions as compared to other metal layers. In some embodiments, at least one of the vias 382, 378, 374, 372, or 368 comprises at least one of a metal, a metal alloy, or other suitable material. In some embodiments, at least one of the vias 382, 378, 374, 372, or 368 comprises at least one of copper, aluminum, tin, nickel, gold, silver, tungsten, TaN, $AL_2O_3$, $ZrO_2$, or other suitable material. In some embodiments, at least some of the vias 382, 378, 374, 372, or 368 have different compositions as compared to other vias. In some embodiments, at least one of (i) the via 382 comprises tungsten, (ii) at least one of the metal layer 380, the via 378, the metal layer 376, the via 374, the metal layer 384, the via 372, the metal layer 370, the via 368, or the metal layer 366 comprises copper, or (iii) the metal layer 388 comprises aluminum. In some embodiments, at least some of the one or more conductive structures 318 have a same composition as at least one of at least some of the metal layers 380, 376, 384, 370, 366, or 388 or at least some of the vias 382, 378, 374, 372, or 368.

In some embodiments, the protective ring 308 comprises a first portion 392, a second portion at a higher elevation than the first portion 392, and a third portion at a higher elevation than the second portion. In some embodiments, the first portion 392 of the protective ring 308 laterally surrounds the first area 302 and/or the one or more conductive structures 318 (shown in FIG. 3A). In some embodiments, the first portion 392 of the protective ring 308 is discontinuous or has a break so as to laterally surround, encircle, etc. some but not all of the first area 302 and/or the one or more conductive structures 318. In some embodiments, the first portion 392 of the protective ring 308 is continuous so as to laterally surround, encircle, etc. all of the first area 302 and/or the one or more conductive structures 318. In some embodiments, the first portion 392 comprises at least one of the via 382, the metal layer 380, the via 378, the metal layer 376, or the via 374.

In some embodiments, the second portion of the protective ring 308 laterally surrounds the first area 302 (shown in FIG. 3A) and/or the one or more conductive structures 318. In some embodiments, the second portion of the protective ring 308 is discontinuous or has a break so as to laterally surround, encircle, etc. some but not all of the first area 302 and/or the one or more conductive structures 318. In some embodiments, the second portion of the protective ring 308 is continuous so as to laterally surround, encircle, etc. all of the first area 302 and/or the one or more conductive structures 318. In some embodiments, the second portion comprises the via 368.

In some embodiments, the third portion of the protective ring 308 laterally surrounds the first area 302 (shown in FIG. 3A) and/or the one or more conductive structures 318. In some embodiments, the third portion of the protective ring 308 is discontinuous or has a break so as to laterally surround, encircle, etc. some but not all of the first area 302 and/or the one or more conductive structures 318. In some embodiments, the third portion of the protective ring 308 is continuous so as to laterally surround, encircle, etc. all of the first area 302 and/or the one or more conductive structures 318. In some embodiments, the third portion comprises the metal layer 388.

In some embodiments, the first portion 392 of the protective ring 308 is not vertically coincident with the second portion of the protective ring 308 in one or more first regions of the protective ring 308. For example, in the one or more first regions of the protective ring 308, the first portion 392 is laterally offset from the second portion such that a vertical line, such as a line orthogonal to a plane within which a greatest extent of a layer of the semiconductor device 300 lies, does not intersect both the first portion 392 and the second portion. In some embodiments, the one or more first regions comprise an entirety of the protective ring 308, and the first portion 392 of the protective ring 308 is not vertically coincident with the second portion of the protective ring 308 in any region of the protective ring 308.

In some embodiments, the first portion 392 of the protective ring 308 is not vertically coincident with the third portion of the protective ring 308 in the one or more first regions of the protective ring 308. For example, in the one or more first regions of the protective ring 308, the first portion 392 is laterally offset from the third portion such that a vertical line does not intersect both the first portion 392 and the third portion.

In some embodiments, the second portion of the protective ring 308 is not vertically coincident with the third portion of the protective ring 308 in the one or more first regions of the protective ring 308. For example, in the one or more first regions of the protective ring 308, the second portion is laterally offset from the third portion such that a vertical line does not intersect both the second portion and the third portion.

In some embodiments, the one or more first regions do not comprise an entirety of the protective ring 308, and the first portion 392 of the protective ring 308 is vertically coincident with the second portion in one or more second regions of the protective ring 308. In some embodiments, the one or more first regions in which the first portion 392 is not vertically coincident with the second portion comprise at least some of the first corner region 304, at least some of the second corner region 306, at least some of the third corner region 326, and/or at least some of the fourth corner region 324. In some embodiments, the one or more second regions in which the first portion 392 is vertically coincident with the second portion comprise at least some of the first wall 310, at least some of the second wall 322, at least some of the third wall 314, and/or at least some of the fourth wall 316.

The view depicted in FIG. 3C includes a cross-section of the third wall 314 of the protective ring 308 in accordance with some embodiments. In some embodiments, in at least some of the third wall 314 of the protective ring 308, the first portion 392 of the protective ring 308 is laterally offset from the second portion of the protective ring 308 such that a vertical line does not intersect both the first portion 392 and the second portion. In some embodiments, in at least some of the third wall 314 of the protective ring 308, the first portion 392 of the protective ring 308 is laterally offset from the third portion of the protective ring 308 such that a vertical line does not intersect both the first portion 392 and the third portion.

Figure 4A:
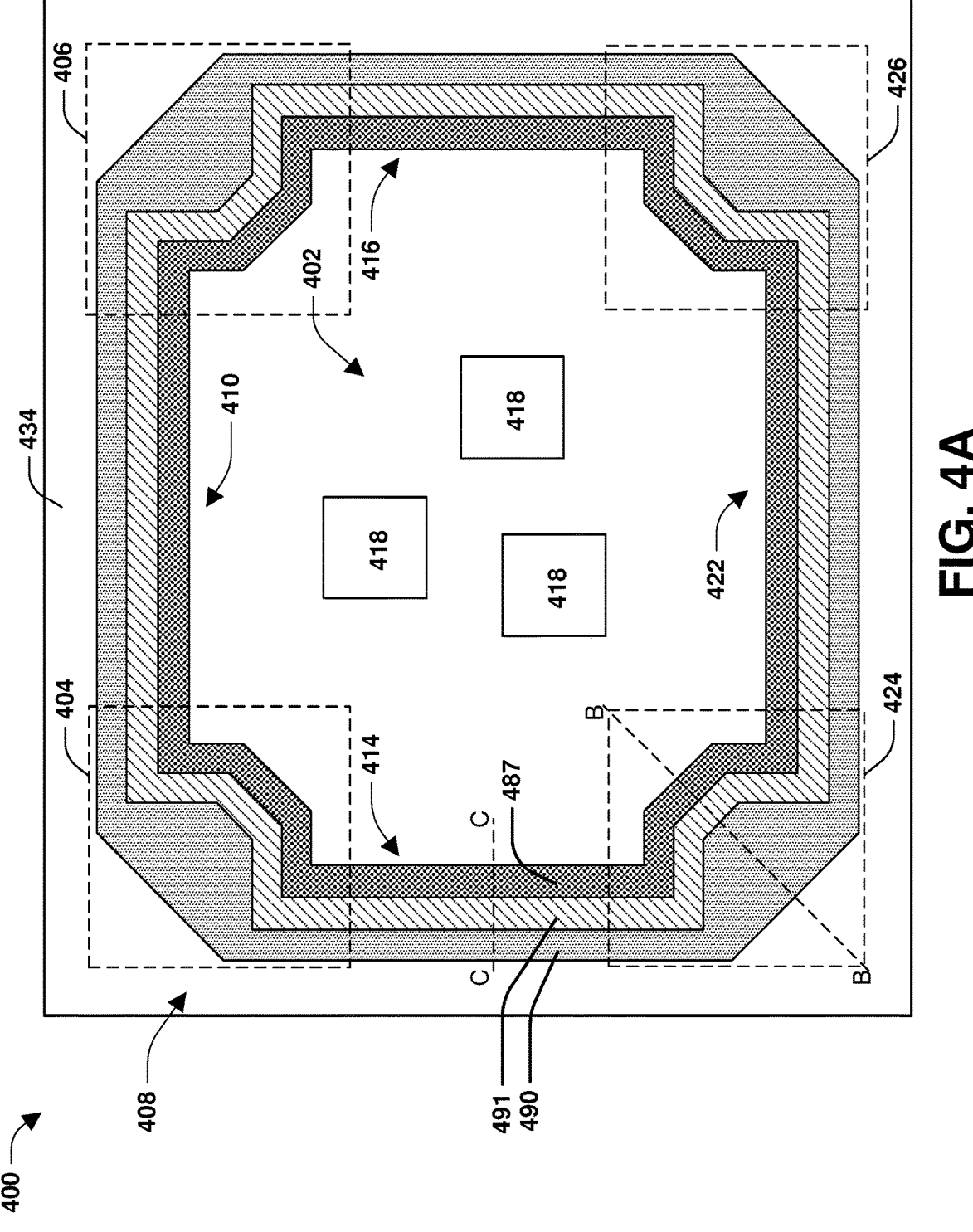
FIG. 4A illustrates a top view of a semiconductor device in accordance with some embodiments.
Figure 4B:
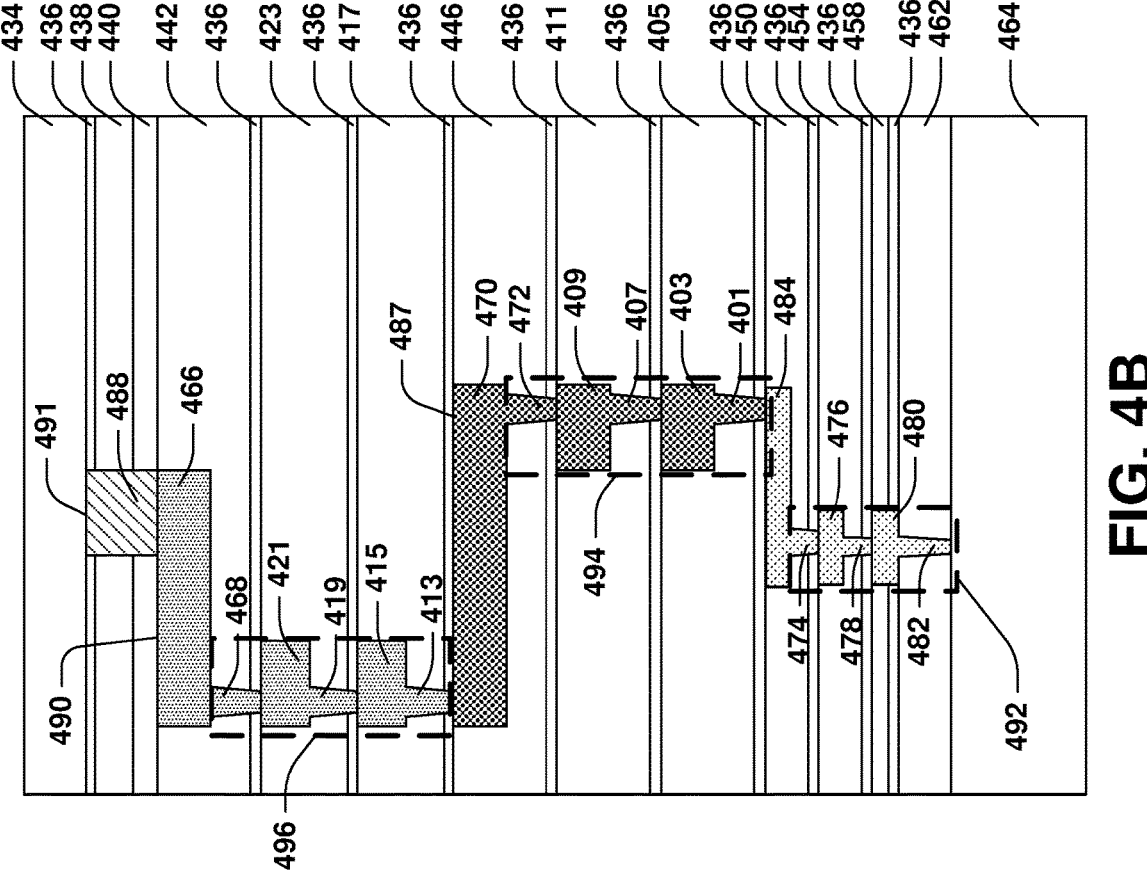
FIG. 4B illustrates a cross-sectional view of a semiconductor device in accordance with some embodiments.
Figure 4B:
Figure 4C:
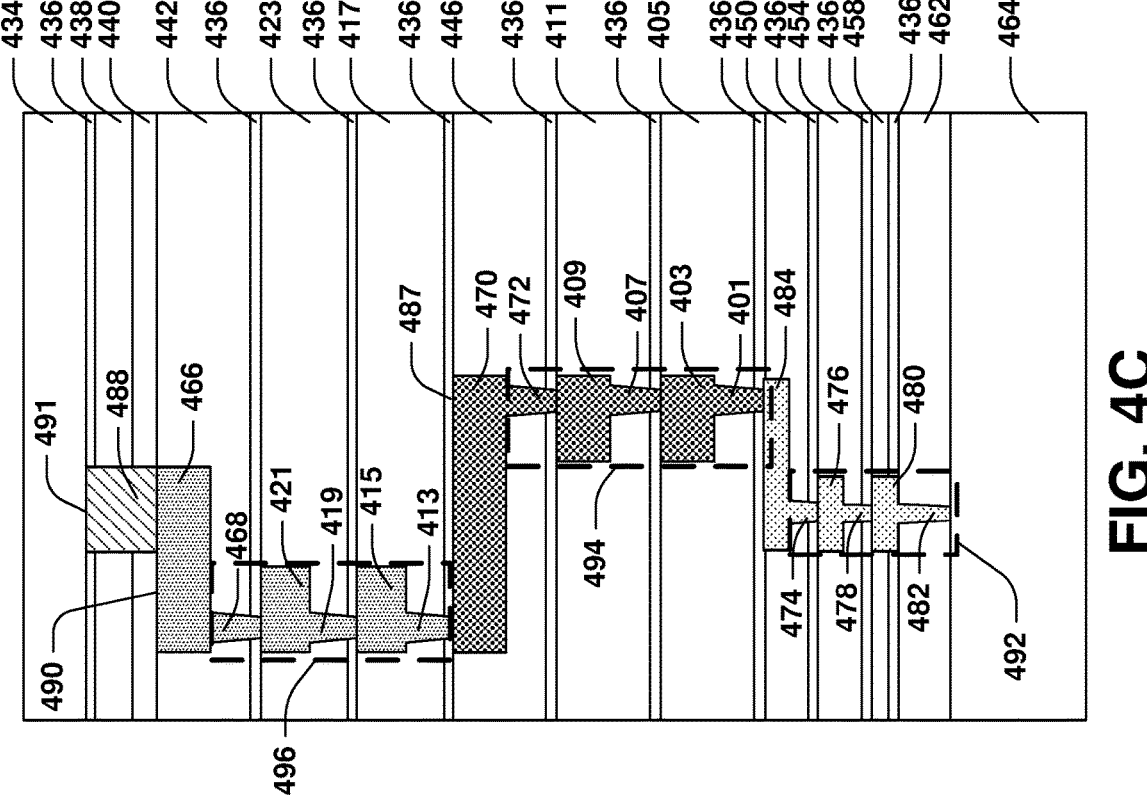
FIG. 4C illustrates a cross-sectional view of a semiconductor device in accordance with some embodiments.
Figure 4C:

FIGS. 4A-4C illustrate a semiconductor device 400 according to some embodiments. FIG. 4A illustrates a top view of the semiconductor device 400. FIG. 4B illustrates a cross-sectional view of the semiconductor device 400 taken along lines B-B of FIG. 4A. FIG. 4C illustrates a cross-sectional view of the semiconductor device 400 taken along lines C-C of FIG. 4A.

The semiconductor device 400 comprises a protective ring 408, such as at least one of a seal ring, a guard ring, etc. In some embodiments, the protective ring 408 laterally surrounds at least one of a first area 402 or one or more conductive structures 418 in the first area 402. In some embodiments, the protective ring 408 is discontinuous or has a break so as to laterally surround, encircle, etc. some but not all of the first area 402 and/or the one or more conductive structures 418. In some embodiments, the protective ring 408 is continuous so as to laterally surround, encircle, etc. all of the first area 402 and/or the one or more conductive structures 418.

In some embodiments, the semiconductor device 400 comprises a first semiconductor layer 434 overlying the protective ring 408. For ease of illustration, layers, features, elements, etc. overlying the protective ring 408 and/or the one or more conductive structures 418 are removed in FIG. 4A to show a top view of the protective ring 408 and/or the one or more conductive structures 418. In accordance with some embodiments, a top surface 487 of a metal layer 470 (shown in FIGS. 4B and 4C), a top surface 490 of a metal layer 466 (shown in FIGS. 4B and 4C) of the protective ring 408, and a top surface 491 of a metal layer 488 (shown in FIGS. 4B and 4C) are depicted in FIG. 4A. In some embodiments, the top surface 487, the top surface 490, and the top surface 491 are at different elevations.

In some embodiments, the one or more conductive structures 418 have one or more of the features, characteristics, relationships, etc. provided herein with respect to the one or more conductive structures 118 of FIGS. 1A-1C.

In some embodiments, the protective ring 408 comprises a first wall 410, a second wall 422 opposing the first wall 410, a third wall 414, and a fourth wall 416 opposing the third wall 414. At least some of the one or more conductive structures 418 are between the first wall 410 and the second wall 422, and at least some of the one or more conductive structures 418 are between the third wall 414 and the fourth wall 416. In some embodiments, the protective ring 408 comprises at least one of a first corner region 404 separating the first wall 410 from the third wall 414, a second corner region 406 separating the fourth wall 416 from the first wall 410, a third corner region 426 separating the second wall 422 from the fourth wall 416, or a fourth corner region 424 separating the third wall 414 from the second wall 422. Other structures and/or configurations of walls and/or corner regions of the protective ring 408 relative to other elements, features, etc. are within the scope of the present disclosure.

According to some embodiments, the protective ring 408 at least one of protects, shields, electrically isolates, etc. at least one of the semiconductor device 400, the one or more conductive structures 418, or one or more other layers, features, etc. of the semiconductor device 400. In some embodiments, the protective ring 408 provides support, reinforcement, structural integrity, etc. for at least one of the semiconductor device 400, the one or more conductive structures 418, or one or more other layers, features, etc. of the semiconductor device 400.

The view depicted in FIG. 4B includes a cross-section of the fourth corner region 424 of the protective ring 408, in accordance with some embodiments. In some embodiments, the semiconductor device 400 comprises at least one of a substrate 464, a second semiconductor layer 462 over the substrate 464, a first dielectric layer 458 over the second semiconductor layer 462, a second dielectric layer 454 over the first dielectric layer 458, a third dielectric layer 450 over the second dielectric layer 454, a fourth dielectric layer 405 over the third dielectric layer 450, a fifth dielectric layer 411 over the fourth dielectric layer 405, a sixth dielectric layer 446 over the fifth dielectric layer 411, a seventh dielectric layer 417 over the sixth dielectric layer 446, an eighth dielectric layer 423 over the seventh dielectric layer 417, a ninth dielectric layer 442 over the eighth dielectric layer 423, a first passivation layer 440 over the ninth dielectric layer 442, a third semiconductor layer 438 over the first passivation layer 440, or the first semiconductor layer 434 over the third semiconductor layer 438. In some embodiments, one or more layers of the semiconductor device 400 have one or more of the features, characteristics, relationships, etc. provided herein with respect to the semiconductor device 100 of FIGS. 1A-1C. In some embodiments, one, some and/or all layers of the semiconductor device 400 are formed using one or more of the techniques provided herein with respect to FIGS. 1A-1C.

In some embodiments, the semiconductor device 400 comprises one or more etch stop layers 436, such as between adjacent layers of the semiconductor device 400. In some embodiments, the one or more etch stop layers 436 have one or more of the features, characteristics, relationships, etc. provided herein with respect to the one or more etch stop layers 136 of FIGS. 1A-1C. In some embodiments, the one or more etch stop layers 436 are formed using one or more of the techniques provided herein with respect to forming the one or more etch stop layers 136 of FIGS. 1A-1C.

In some embodiments, the protective ring 408 is provided within one or more first dielectric layers of the semiconductor device 400. For example, according to some embodiments, the protective ring 408 extends through at least some of the one or more first dielectric layers and/or through at least some of one or more other layers of the semiconductor device 400. In some embodiments, the one or more first dielectric layers comprise at least one of the dielectric layers 458, 454, 450, 405, 411, 446, 417, 423, or 442. According to some embodiments, the protective ring 408 includes alternating layers of a metal layer and a via. In some embodiments, the protective ring 408 comprises at least one of a via 482, a metal layer 480 overlying the via 482, a via 478 overlying the metal layer 480, a metal layer 476 overlying the via 478, a via 474 overlying the metal layer 476, a metal layer 484 overlying the via 474, a via 401 overlying the metal layer 484, a metal layer 403 overlying the via 401, a via 407 overlying the metal layer 403, a metal layer 409 overlying the via 407, a via 472 overlying the metal layer 409, the metal layer 470 overlying the via 472, a via 413 overlying the metal layer 470, a metal layer 415 overlying the via 413, a via 419 overlying the metal layer 415, a metal layer 421 overlying the via 419, a via 468 overlying the metal layer 421, the metal layer 466 overlying the via 468, or the metal layer 488 overlying the metal layer 466. In some embodiments, a metal layer or via of the protective ring 408 is in contact with, such as in direct contact with, an adjacent via or metal layer. In some embodiments, at least one of the metal layer 480 is in contact with the via 482, the via 478 is in contact with the metal layer 480, the metal layer 476 is in contact with the via 478, the via 474 is in contact with the metal layer 476, the metal layer 484 is in contact with the via 474, the via 401 is in contact with the metal layer 484, the metal layer 403 is in contact with the via 401, the via 407 is in contact with the metal layer 403, the metal layer 409 is in contact with the via 407, the via 472 is in contact with the metal layer 409, the metal layer 470 is in contact with the via 472, the via 413 is in contact with the metal layer 470, the metal layer 415 is in contact with the via 413, the via 419 is in contact with the metal layer 415, the metal layer 421 is in contact with the via 419, the via 468 is in contact with the metal layer 421, the metal layer 466 is in contact with the via 468, or the metal layer 488 is in contact with the metal layer 466. Other structures and/or configurations of vias and/or metal layers of the protective ring 408 relative to other elements, features, etc. are within the scope of the present disclosure.

In some embodiments, vias and/or metal layers of the protective ring 408 have one or more of the features, characteristics, relationships, etc. provided herein with respect to vias and/or metal layers of the protective ring 108 of FIGS. 1A-1C. In some embodiments, vias and/or metal layers of the protective ring 408 are formed using one or more of the techniques provided herein with respect to forming vias and/or metal layers of the protective ring 108 of FIGS. 1A-1C.

In some embodiments, the protective ring 408 is discontinuous in that one or more intervening dielectric layers do not include at least one of a metal layer or a via of the protective ring 408. In some embodiments, the protective ring 408 is continuous in that intervening dielectric layers include at least one of a metal layer or a via of the protective ring 408.

In some embodiments, at least one of the metal layers 480, 476, 484, 403, 409, 470, 415, 421, 466, or 488 comprises at least one of a metal, a metal alloy, or other suitable material. In some embodiments, at least one of the metal layers 480, 476, 484, 403, 409, 470, 415, 421, 466, or 488 comprises at least one of copper, aluminum, tin, nickel, gold, silver, tungsten, TaN, AL2O3, ZrO2, or other suitable material. In some embodiments, at least some of the metal layers 480, 476, 484, 403, 409, 470, 415, 421, 466, or 488 have different compositions as compared to other metal layers. In some embodiments, at least one of the vias 482, 478, 474, 401, 407, 472, 413, 419, or 468 comprises at least one of a metal, a metal alloy, or other suitable material. In some embodiments, at least one of the vias 482, 478, 474, 401, 407, 472, 413, 419, or 468 comprises at least one of copper, aluminum, tin, nickel, gold, silver, tungsten, TaN, Al2O3, ZrO2, or other suitable material. In some embodiments, at least some of the vias 482, 478, 474, 401, 407, 472, 413, 419, or 468 have different compositions as compared to other vias. In some embodiments, at least one of (i) the via 482 comprises tungsten, (ii) at least one of the metal layer 480, the via 478, the metal layer 476, the via 474, the metal layer 484, the via 401, the metal layer 403, the via 407, the metal layer 409, the via 472, the metal layer 470, the via 413, the metal layer 415, the via 419, the metal layer 421, the via 468, or the metal layer 466 comprises copper, or (iii) the metal layer 488 comprises aluminum. In some embodiments, at least some of the one or more conductive structures 418 have a same composition as at least one of at least some of the metal layers 480, 476, 484, 403, 409, 470, 415, 421, 466, or 488 or at least some of the vias 482, 478, 474, 401, 407, 472, 413, 419, or 468.

In some embodiments, the protective ring 408 comprises a first portion 492, a second portion 494 at a higher elevation than the first portion 492, and a third portion 496 at a higher elevation than the second portion 494. In some embodiments, the first portion 492 of the protective ring 408 laterally surrounds the first area 402 and/or the one or more conductive structures 418 (shown in FIG. 4A). In some embodiments, the first portion 492 of the protective ring 408 is discontinuous or has a break so as to laterally surround, encircle, etc. some but not all of the first area 402 and/or the one or more conductive structures 418. In some embodiments, the first portion 492 of the protective ring 408 is continuous so as to laterally surround, encircle, etc. all of the first area 402 and/or the one or more conductive structures 418. In some embodiments, the first portion 492 comprises at least one of the via 482, the metal layer 480, the via 478, the metal layer 476, or the via 474.

In some embodiments, the second portion 494 of the protective ring 408 laterally surrounds the first area 402 (shown in FIG. 4A) and/or the one or more conductive structures 418. In some embodiments, the second portion 494 of the protective ring 408 is discontinuous or has a break so as to laterally surround, encircle, etc. some but not all of the first area 402 and/or the one or more conductive structures 418. In some embodiments, the second portion 494 of the protective ring 408 is continuous so as to laterally surround, encircle, etc. all of the first area 402 and/or the one or more conductive structures 418. In some embodiments, the second portion 494 comprises at least one of the via 401, the metal layer 403, the via 407, the metal layer 409, or the via 472.

In some embodiments, the third portion 496 of the protective ring 408 laterally surrounds the first area 402 (shown in FIG. 4A) and/or the one or more conductive structures 418. In some embodiments, the third portion 496 of the protective ring 408 is discontinuous or has a break so as to laterally surround, encircle, etc. some but not all of the first area 402 and/or the one or more conductive structures 418. In some embodiments, the third portion 496 of the protective ring 408 is continuous so as to laterally surround, encircle, etc. all of the first area 402 and/or the one or more conductive structures 418. In some embodiments, the third portion 496 comprises at least one of the via 413, the metal layer 415, the via 419, the metal layer 421, or the via 468.

In some embodiments, the first portion 492 of the protective ring 408 is not vertically coincident with the second portion 494 of the protective ring 408 in one or more first regions of the protective ring 408. For example, in the one or more first regions of the protective ring 408, the first portion 492 is laterally offset from the second portion 494 such that a vertical line, such as a line orthogonal to a plane within which a greatest extent of a layer of the semiconductor device 400 lies, does not intersect both the first portion 492 and the second portion 494. In some embodiments, the one or more first regions comprise an entirety of the protective ring 408, and the first portion 492 of the protective ring 408 is not vertically coincident with the second portion 494 of the protective ring 408 in any region of the protective ring 408.

In some embodiments, the first portion 492 of the protective ring 408 is not vertically coincident with the third portion 496 of the protective ring 408 in the one or more first regions of the protective ring 408. For example, in the one or more first regions of the protective ring 408, the first portion 492 is laterally offset from the third portion 496 such that a vertical line does not intersect both the first portion 492 and the third portion 496.

In some embodiments, the second portion 494 of the protective ring 408 is not vertically coincident with the third portion 496 of the protective ring 408 in the one or more first regions of the protective ring 408. For example, in the one or more first regions of the protective ring 408, the second portion 494 is laterally offset from the third portion 496 such that a vertical line does not intersect both the second portion 494 and the third portion 496.

In some embodiments, the one or more first regions do not comprise an entirety of the protective ring 408, and the first portion 492 of the protective ring 408 is vertically coincident with the second portion 494 in one or more second regions of the protective ring 408. In some embodiments, the one or more first regions in which the first portion 492 is not vertically coincident with the second portion 494 comprise at least some of the first corner region 404, at least some of the second corner region 406, at least some of the third corner region 426, and/or at least some of the fourth corner region 424. In some embodiments, the one or more second regions in which the first portion 492 is vertically coincident with the second portion 494 comprise at least some of the first wall 410, at least some of the second wall 422, at least some of the third wall 414, and/or at least some of the fourth wall 416.

The view depicted in FIG. 4C includes a cross-section of the third wall 414 of the protective ring 408 in accordance with some embodiments. In some embodiments, in at least some of the third wall 414 of the protective ring 408, the first portion 492 of the protective ring 408 is laterally offset from the second portion 494 of the protective ring 408 such that a vertical line does not intersect both the first portion 492 and the second portion 494. In some embodiments, in at least some of the third wall 414 of the protective ring 408, the first portion 492 of the protective ring 408 is laterally offset from the third portion 496 of the protective ring 408 such that a vertical line does not intersect both the first portion 492 and the third portion 496.

Figure 5:
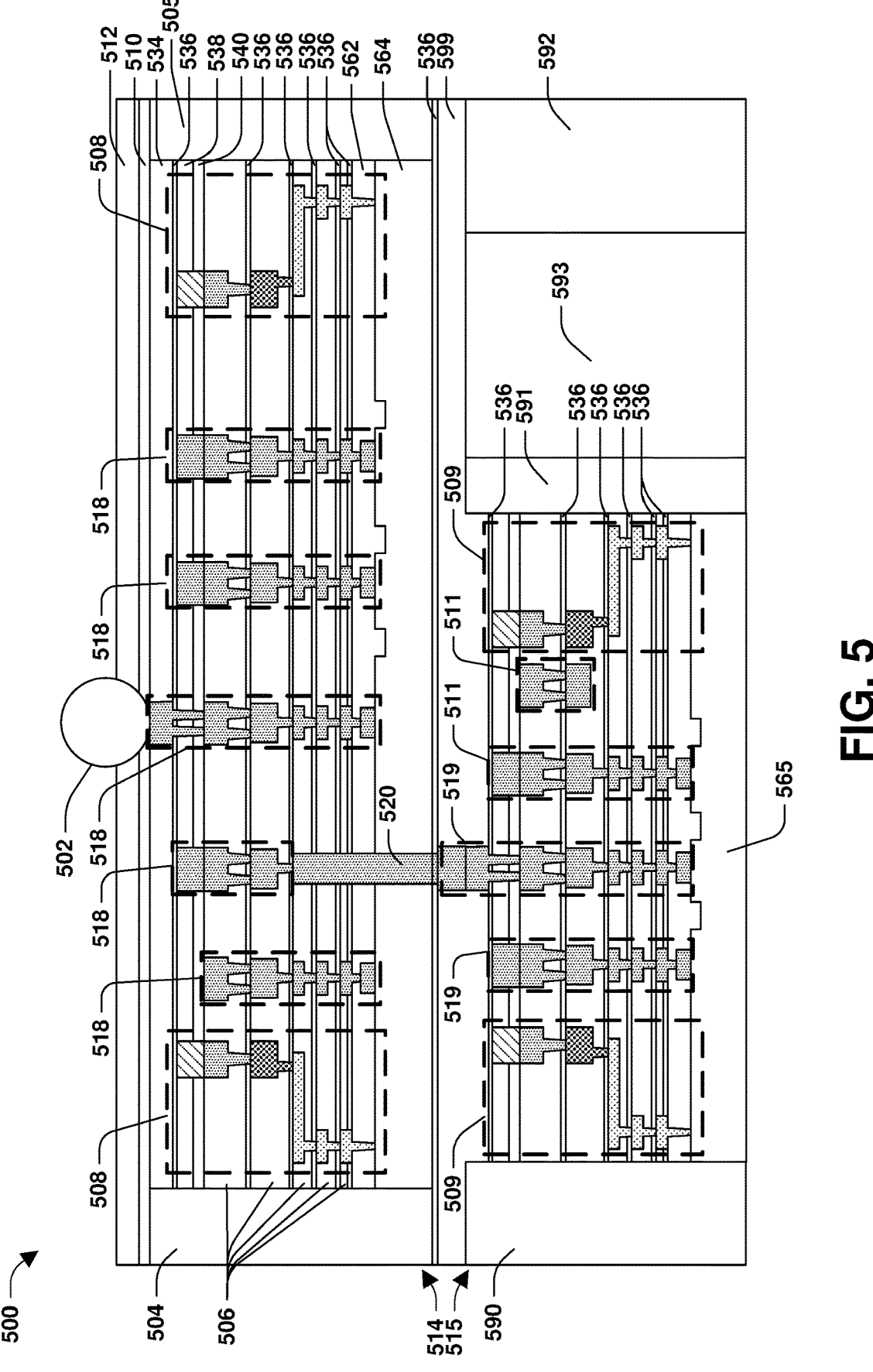
FIG. 5 illustrates a cross-sectional view of a semiconductor device in accordance with some embodiments.

FIG. 5 illustrates a semiconductor device 500 according to some embodiments. In some embodiments, the semiconductor device 500 comprises a first portion 514 and a second portion 515. In some embodiments, the first portion 514 comprises at least one of a first die, a first wafer, etc. and the second portion 515 comprises at least one of a second die, a second wafer, etc. In some embodiments, the first portion 514 and the second portion 515 are fabricated separately and then placed together.

In some embodiments, the first portion 514 of the semiconductor device 500 comprises at least one of a first gap fill structure 504, a second gap fill structure 505, a first substrate 564, a semiconductor layer 562 over the first substrate 564, one or more dielectric layers 506 over the semiconductor layer 562, a first passivation layer 540 over the one or more dielectric layers 506, a semiconductor layer 538 over the first passivation layer 540, a semiconductor layer 534 over the semiconductor layer 538, a semiconductor layer 510 over the semiconductor layer 534, or a layer 512 over the semiconductor layer 510. In some embodiments, at least one of the first substrate 564, the semiconductor layer 562, the one or more dielectric layers 506, the first passivation layer 540, the semiconductor layer 538, or the semiconductor layer 534 are between the first gap fill structure 504 and the second gap fill structure 505. In some embodiments, one, some and/or all layers of the first portion 514 are formed using one or more of the techniques provided herein with respect to FIGS. 1A-1C.

In some embodiments, the first substrate 564 has one or more of the features, characteristics, relationships, etc. provided herein with respect to the substrate 164 of FIGS. 1A-1C. In some embodiments, the semiconductor layer 562 has one or more of the features, characteristics, relationships, etc. provided herein with respect to the second semiconductor layer 162 of FIGS. 1A-1C. In some embodiments, the semiconductor layer 562 is a middle-of-line (MOL) layer. In some embodiments, the one or more dielectric layers 506 have one or more of the features, characteristics, relationships, etc. provided herein with respect to dielectric layers 154, 150, 146, and 142 of FIGS. 1A-1C. In some embodiments, the one or more dielectric layers 506 are one or more back-end-of-line (BEOL) layers. In some embodiments, the first passivation layer 540 has one or more of the features, characteristics, relationships, etc. provided herein with respect to the first passivation layer 140 of FIGS. 1A-1C. In some embodiments, the semiconductor layer 538 has one or more of the features, characteristics, relationships, etc. provided herein with respect to the third semiconductor layer 138 of FIGS. 1A-1C. In some embodiments, the semiconductor layer 534 has one or more of the features, characteristics, relationships, etc. provided herein with respect to the first semiconductor layer 134 of FIGS. 1A-1C. In some embodiments, the semiconductor layer 510 is a second passivation layer having one or more of the features, characteristics, relationships, etc. provided herein with respect to the first passivation layer 140 of FIGS. 1A-1C. In some embodiments, the semiconductor layer 510 has a same composition as the first passivation layer 540. In some embodiments, the semiconductor layer 510 has a different composition than the first passivation layer 540.

According to some embodiments, the first portion 514 of the semiconductor device 500 comprises one or more first conductive structures 518. In some embodiments, the one or more first conductive structures 518 have one or more of the features, characteristics, relationships, etc. provided herein with respect to the one or more conductive structures 118 of FIGS. 1A-1C. In some embodiments, a solder bump 502 is in contact with a conductive structure of the one or more first conductive structures 518. In some embodiments, the solder bump 502 is used to connect the semiconductor device 500 to a second semiconductor device (not shown). In some embodiments, the one or more first conductive structures 518 comprise at least one of BEOL interconnects or MOL interconnects. In some embodiments, the one or more first conductive structures 518 comprises at least one of one or more BEOL interconnects in the in the one or more dielectric layers 506 or one or more MOL interconnects in the semiconductor layer 562.

According to some embodiments, the first portion 514 of the semiconductor device 500 comprises a first protective ring 508. In some embodiments, the first protective ring 508 has one or more of the features, characteristics, relationships, etc. provided herein with respect to at least one of the protective ring 108 of FIGS. 1A-1C, the protective ring 208 of FIGS. 2A-2C, the protective ring 308 of FIGS. 3A-3C, or the protective ring 408 of FIGS. 4A-4C. In some embodiments, the first protective ring 508 at least one of protects, shields, electrically isolates, etc. at least one of the one or more first conductive structures 518, or one or more other layers, features, etc. of the semiconductor device 500. In some embodiments, the first protective ring 508 provides support, reinforcement, structural integrity, etc. for at least one of the semiconductor device 500, the one or more first conductive structures 518, or one or more other layers, features, etc. of the semiconductor device 500.

In some embodiments, the semiconductor device 500 comprises one or more etch stop layers 536, such as between adjacent layers of the semiconductor device 500. In some embodiments, the one or more etch stop layers 536 have one or more of the features, characteristics, relationships, etc. provided herein with respect to the one or more etch stop layers 136 of FIGS. 1A-1C. In some embodiments, the one or more etch stop layers 536 are formed using one or more of the techniques provided herein with respect to forming the one or more etch stop layers 536 of FIGS. 1A-1C.

In some embodiments, the semiconductor device 500 comprises a semiconductor layer 599 between the first portion 514 and the second portion 515. In some embodiments, the semiconductor layer 599 promotes adhesion between the first portion 514 and the second portion 515. In some embodiments, the semiconductor layer 599 comprises at least one of silicon, an oxide semiconductor material such as silicon oxide, a nitride semiconductor material such as silicon nitride, an oxide nitride material, or other suitable material.

In some embodiments, the second portion 515 of the semiconductor device 500 has one or more of the features, characteristics, relationships, etc. provided herein with respect to the first portion 514. In some embodiments, the second portion 515 comprises at least one of a third gap fill structure 590, a fourth gap fill structure 591, a fifth gap fill structure 592, a semiconductor structure 593, a second substrate 565, one or more second conductive structures 519, or a second protective ring 509. In some embodiments, the second protective ring 509 at least one of protects, shields, electrically isolates, etc. at least one of the one or more second conductive structures 519, or one or more other layers, features, etc. of the semiconductor device 500. In some embodiments, at least one of the first gap fill structure 504, the second gap fill structure 505, the third gap fill structure 590, the fourth gap fill structure 591, or the fifth gap fill structure 592 comprises at least one of oxide semiconductor material, such as silicon oxide, or other suitable material. In some embodiments, the semiconductor structure 593 separates the fourth gap fill structure 591 from the fifth gap fill structure 592. In some embodiments, the semiconductor structure 593 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. In some embodiments, the semiconductor structure 593 has a same composition as at least one of the first substrate 564 or the second substrate 565. In some embodiments, the semiconductor structure 593 has a different composition than at least one of the first substrate 564 or the second substrate 565. In some embodiments, a metal interconnect 520 provides an electrical connection between the one or more first conductive structures 518 and the one or more second conductive structures 519.

A method 600 for forming a semiconductor device is illustrated in FIG. 6 in accordance with some embodiments. At 602, a first portion of a protective ring is formed, wherein the first portion of the protective ring laterally surrounds a first area. At 604, a second portion of the protective ring is formed over the first portion of the protective ring. The second portion of the protective ring laterally surrounds the first area. In one or more first regions, a first section of the second portion of the protective ring is vertically coincident with the first portion of the protective ring. In the one or more first regions, a second section of the second portion of the protective ring is not vertically coincident with the first portion of the protective ring. At 606, a third portion of the protective ring is formed over the second portion of the protective ring. The third portion of the protective ring laterally surrounds the first area. In the one or more first regions, the second section of the second portion of the protective ring is vertically coincident with the third portion of the protective ring. In the one or more first regions, the first section of the second portion of the protective ring is not vertically coincident with the third portion of the protective ring. The one or more first regions include at least some of the first portion of the protective ring, at least some of the second portion of the protective ring, and at least some of the third portion of the protective ring.

In some embodiments, the protective ring comprises the protective ring 108 of FIGS. 1A-1C. In some embodiments, the first portion of the protective ring corresponds to the first portion 192 shown in FIGS. 1B and 1C, the second portion of the protective ring corresponds to the metal layer 184 shown in FIGS. 1B and 1C, and the third portion of the protective ring corresponds to the second portion 194 shown in FIGS. 1B and 1C. In some embodiments, forming the first portion of the protective ring comprises forming at least one of the via 182 (shown in FIGS. 1B and 1C), the metal layer 180, the via 178, the metal layer 176, or the via 174. In some embodiments, forming the second portion of the protective ring comprises forming the metal layer 184 (shown in FIGS. 1B and 1C). In some embodiments, the first section of the second portion of the protective ring corresponds to the first section 184a of the metal layer 184. In some embodiments, the second section of the second portion of the protective ring corresponds to the second section 184b of the metal layer 184. In some embodiments, forming the third portion of the protective ring comprises forming at least one of the via 172, the metal layer 170, the via 168, the metal layer 166, or the metal layer 188.

In some embodiments, a semiconductor device is provided. The semiconductor device includes one or more conductive structures and a protective ring. The protective ring includes a first portion and a second portion at a higher elevation than the first portion. The one or more conductive structures are laterally surrounded by the first portion of the protective ring. The one or more conductive structures are laterally surrounded by the second portion of the protective ring. In one or more first regions of the protective ring, the first portion of the protective ring is at least partially laterally offset from the second portion of the protective ring, such that at least some of the first portion is not vertically coincident with the second portion. In some embodiments, in the one or more first regions of the protective ring, a first section of the first portion of the protective ring is not vertically coincident with the second portion of the protective ring, while a second section of the first portion of the protective ring is vertically coincident with the second portion of the protective ring.

In some embodiments, a semiconductor device is provided. The semiconductor device includes one or more dielectric layers. The semiconductor device includes one or more conductive structures in the one or more dielectric layers. The semiconductor device includes a protective ring provided within the one or more dielectric layers. The protective ring includes a first portion including at least one of one or more first vias or one or more first metal layers. The protective ring includes a second portion, at a higher elevation than the first portion, including at least one of one or more second vias or one or more second metal layers. The one or more conductive structures are laterally surrounded by the first portion of the protective ring. The one or more conductive structures are laterally surrounded by the second portion of the protective ring. In one or more first regions of the protective ring, the first portion of the protective ring is not vertically coincident with the second portion of the protective ring.

In some embodiments, a semiconductor device is provided. The semiconductor device includes one or more conductive structures and a protective ring. The protective ring includes a first portion and a second portion at a higher elevation than the first portion. The one or more conductive structures are laterally surrounded by the first portion of the protective ring. The one or more conductive structures are laterally surrounded by the second portion of the protective ring. In one or more first regions of the protective ring, the first portion of the protective ring is not vertically coincident with the second portion of the protective ring.

In some embodiments, a method for forming a semiconductor device is provided. The method includes forming a first portion of a protective ring, wherein the first portion of the protective ring laterally surrounds a first area. The method includes forming a second portion of the protective ring over the first portion of the protective ring. The second portion of the protective ring laterally surrounds the first area. In one or more first regions, a first section of the second portion of the protective ring is vertically coincident with the first portion of the protective ring. In the one or more first regions, a second section of the second portion of the protective ring is not vertically coincident with the first portion of the protective ring. The method includes forming a third portion of the protective ring over the second portion of the protective ring. The third portion of the protective ring laterally surrounds the first area. In the one or more first regions, the second section of the second portion of the protective ring is vertically coincident with the third portion of the protective ring. In the one or more first regions, the first section of the second portion of the protective ring is not vertically coincident with the third portion of the protective ring. The one or more first regions include at least some of the first portion of the protective ring, at least some of the second portion of the protective ring, and at least some of the third portion of the protective ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
one or more dielectric layers;
one or more conductive structures in the one or more dielectric layers;
a passivation layer over the one or more dielectric layers; and
a protective ring, provided within the one or more dielectric layers, comprising:
    a first portion comprising at least one of:
        one or more first vias; or
        one or more first metal layers; and
    a second portion, at a higher elevation than the first portion, comprising at least one of:
        one or more second vias; or
        one or more second metal layers,
    wherein:
        the one or more conductive structures are laterally surrounded by the first portion of the protective ring;
        the one or more conductive structures are laterally surrounded by the second portion of the protective ring; and
        in one or more first regions of the protective ring, the first portion of the protective ring is not vertically coincident with the second portion of the protective ring.

2. The semiconductor device of claim 1, wherein:
the protective ring comprises:
    a first wall;
    a second wall opposing the first wall, wherein one or more first conductive structures of the one or more conductive structures are between the first wall and the second wall;
    a third wall; and
    a fourth wall opposing the third wall, wherein one or more second conductive structures of the one or more conductive structures are between the third wall and the fourth wall; and
the one or more first regions comprise at least one of:
    a first corner region separating the first wall from the third wall;
    a second corner region separating the fourth wall from the first wall;
    a third corner region separating the second wall from the fourth wall; or
    a fourth corner region separating the third wall from the second wall.

3. The semiconductor device of claim 1, wherein:
the one or more first regions of the protective ring comprise an entirety of the protective ring.

4. The semiconductor device of claim 1, wherein:
the protective ring comprises a third portion at a higher elevation than the first portion and a lower elevation than the second portion;
the one or more conductive structures are laterally surrounded by the third portion of the protective ring; and
in the one or more first regions of the protective ring, the third portion of the protective ring is vertically coincident with the first portion of the protective ring and the second portion of the protective ring.

5. The semiconductor device of claim 4, wherein:
the third portion of the protective ring is in contact with at least one of the first portion of the protective ring or the second portion of the protective ring.

6. The semiconductor device of claim 4, wherein:
the third portion comprises at least one of:
    one or more third vias; or
    one or more third metal layers.

7. The semiconductor device of claim 1, comprising:
a semiconductor layer over the passivation layer.

8. The semiconductor device of claim 7, wherein:
the protective ring is provided within the semiconductor layer.

9. The semiconductor device of claim 1, wherein:
the protective ring is provided within the passivation layer.

10. The semiconductor device of claim 1, comprising:
a substrate under the one or more dielectric layers.

11. The semiconductor device of claim 1, wherein:
the first portion of the protective ring is in one or more first dielectric layers of the one or more dielectric layers;
the second portion of the protective ring is in one or more second dielectric layers of the one or more dielectric layers; and
the one or more second dielectric layers overlie the one or more first dielectric layers.

12. A method for forming a semiconductor device, comprising:
forming a first dielectric layer;
forming a first portion of a protective ring, wherein;
    forming the first portion of the protective ring comprises forming at least one of a first metal layer or a first via in the first dielectric layer; and
    the first portion of the protective ring laterally surrounds a first area;
forming a second dielectric layer over the first dielectric layer;
forming a second portion of the protective ring over the first portion of the protective ring, wherein:
    forming the second portion of the protective ring comprises forming at least one of a second metal layer or a second via in the second dielectric layer;
    the second portion of the protective ring laterally surrounds the first area;
    in one or more first regions, a first section of the second portion of the protective ring is vertically coincident with the first portion of the protective ring; and
    in the one or more first regions, a second section of the second portion of the protective ring is not vertically coincident with the first portion of the protective ring;
forming a passivation layer over the second dielectric layer; and
forming a third portion of the protective ring over the second portion of the protective ring, wherein:
    the third portion of the protective ring laterally surrounds the first area;

in the one or more first regions, the second section of the second portion of the protective ring is vertically coincident with the third portion of the protective ring;

in the one or more first regions, the first section of the second portion of the protective ring is not vertically coincident with the third portion of the protective ring; and the one or more first regions comprise at least some of the first portion of the protective ring, at least some of the second portion of the protective ring, and at least some of the third portion of the protective ring.

13. The method of claim 12, wherein:

forming the second portion of the protective ring comprises forming the second metal layer over the first portion of the protective ring.

14. The method of claim 12, wherein:

forming at least one of the first metal layer or the first via in the first dielectric layer comprises performing a damascene process.

15. The method of claim 12, comprising:

forming one or more conductive structures in the first area.

16. A method for forming a semiconductor device, comprising:

forming a first dielectric layer;

forming a first portion of a protective ring, wherein:

forming the first portion of the protective ring comprises performing a damascene process to form at least one of a first metal layer or a first via in the first dielectric layer; and the first portion of the protective ring laterally surrounds a first area;

forming a second dielectric layer over the first dielectric layer;

forming a second portion of the protective ring over the first portion of the protective ring, wherein:

forming the second portion of the protective ring comprises forming at least one of a second metal layer or a second via in the second dielectric layer;

the second portion of the protective ring laterally surrounds the first area;

in one or more first regions, a first section of the second portion of the protective ring is vertically coincident with the first portion of the protective ring; and in the one or more first regions, a second section of the second portion of the protective ring is not vertically coincident with the first portion of the protective ring; and forming a third portion of the protective ring over the second portion of the protective ring, wherein:

the third portion of the protective ring laterally surrounds the first area;

in the one or more first regions, the second section of the second portion of the protective ring is vertically coincident with the third portion of the protective ring;

in the one or more first regions, the first section of the second portion of the protective ring is not vertically coincident with the third portion of the protective ring; and the one or more first regions comprise at least some of the first portion of the protective ring, at least some of the second portion of the protective ring, and at least some of the third portion of the protective ring.

17. The method of claim 16, wherein:

forming the second portion of the protective ring comprises forming the second metal layer over the first portion of the protective ring.

18. The method of claim 16, comprising:

forming one or more conductive structures in the first area.

19. The method of claim 16, wherein:

forming the second portion of the protective ring comprises forming the second portion of the protective ring to contact the first portion of the protective ring.

20. The method of claim 19, wherein:

forming the third portion of the protective ring comprises forming the third portion of the protective ring to contact the second portion of the protective ring.

* * * * *